(12) United States Patent
Nakazawa et al.

(10) Patent No.: US 9,276,128 B2
(45) Date of Patent: Mar. 1, 2016

(54) SEMICONDUCTOR DEVICE, METHOD FOR MANUFACTURING THE SAME, AND ETCHANT USED FOR THE SAME

(71) Applicant: Semiconductor Energy Laboratory Co., Ltd., Kanagawa-ken (JP)

(72) Inventors: Yasutaka Nakazawa, Tochigi (JP); Shunsuke Koshioka, Tochigi (JP); Takayuki Cho, Tochigi (JP); Takahiro Sato, Tochigi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/518,362

(22) Filed: Oct. 20, 2014

(65) Prior Publication Data
US 2015/0108473 A1 Apr. 23, 2015

(30) Foreign Application Priority Data

Oct. 22, 2013 (JP) .................................. 2013-218953

(51) Int. Cl.
*H01L 21/00* (2006.01)
*H01L 29/786* (2006.01)
*H01L 21/4763* (2006.01)
*H01L 21/3213* (2006.01)
*C23F 1/02* (2006.01)
*C23F 1/18* (2006.01)
(Continued)

(52) U.S. Cl.
CPC .............. *H01L 29/7869* (2013.01); *C23F 1/02* (2013.01); *C23F 1/18* (2013.01); *C23F 1/26* (2013.01); *H01L 21/32134* (2013.01); *H01L 21/47635* (2013.01); *C09K 13/00* (2013.01)

(58) Field of Classification Search
None
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Asakuma.N. et al., "Crystallization and Reduction of Sol-Gel-Derived Zinc Oxide Films by Irraiation with Ultraviolet Lamp", Journal of Sol-Gel Science and Technology, 2003, vol. 26, pp. 181-184.
(Continued)

Primary Examiner — Stanetta Isaac
(74) Attorney, Agent, or Firm — Husch Blackwell LLP

(57) ABSTRACT

A method for manufacturing a semiconductor device includes the steps of forming a first conductive film over a substrate; forming an insulating film over the first conductive film; forming an oxide semiconductor film over the insulating film to overlap with the first conductive film; forming a second conductive film including a metal film containing molybdenum as its main component and a metal film containing copper as its main component over the oxide semiconductor film; and etching the second conductive film by an etchant. At the time of etching the second conductive film by the etchant, the oxide semiconductor film is used as an etching stopper film. In addition, the etchant which can be used for a transistor including the oxide semiconductor film is provided.

18 Claims, 13 Drawing Sheets

(51) Int. Cl.
  *C23F 1/26* (2006.01)
  *C09K 13/00* (2006.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,780,784 B2 | 8/2004 | Jo et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,563,658 B2 | 7/2009 | Ishizuka et al. |
| 7,674,650 B2 | 3/2010 | Akimoto et al. |
| 7,732,819 B2 | 6/2010 | Akimoto et al. |
| 7,850,866 B2 | 12/2010 | Jo et al. |
| 7,910,490 B2 | 3/2011 | Akimoto et al. |
| 7,915,075 B2 | 3/2011 | Suzawa et al. |
| 7,932,521 B2 | 4/2011 | Akimoto et al. |
| 8,236,704 B2 | 8/2012 | Jo et al. |
| 8,242,494 B2 | 8/2012 | Suzawa et al. |
| 8,274,077 B2 | 9/2012 | Akimoto et al. |
| 8,343,799 B2 | 1/2013 | Ito et al. |
| 8,466,463 B2 | 6/2013 | Akimoto et al. |
| 8,629,069 B2 | 1/2014 | Akimoto et al. |
| 8,669,550 B2 | 3/2014 | Akimoto et al. |
| 8,673,426 B2 | 3/2014 | Yamazaki et al. |
| 8,790,959 B2 | 7/2014 | Akimoto et al. |
| 8,796,069 B2 | 8/2014 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308805 A1 | 12/2008 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0104851 A1 | 5/2011 | Akimoto et al. |
| 2011/0121290 A1 | 5/2011 | Akimoto et al. |
| 2012/0319033 A1* | 12/2012 | Okabe et al. ............. 252/79.4 |
| 2013/0302938 A1 | 11/2013 | Sato et al. |
| 2014/0004656 A1 | 1/2014 | Sasagawa et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-302780 | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-123861 | 5/2007 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

(56) References Cited

OTHER PUBLICATIONS

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Costello.M at al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technica Digest of International Electron Devices Meeting, Dec. 5, 2005, pp. 1067-1069.

Fortunato.E at al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of The Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 38, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID Internationl Symposium Digst of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and Sc2O3—A2O3—BO Systems [A; Fe, Ga, or, Al; B: Mg, Mn, Fe, Ni, Cu,or Zn] at Temperatures Over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Paper, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M at al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

(56) References Cited

OTHER PUBLICATIONS

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vo. 85. No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B. (Physical Review. B), 2008, vol. 77, pp. 245202-1-245202-6.
Oh.M at al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, pp. 1811-1816.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M at al., "A Ferroelectric Transparent Thin-Film Transistor", Appl. Phys. Lett. (Applied Physics Letters), Jun. 17, 1996, vol. 68, No. 25, pp. 3650-3652.
Sakata.J at al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner 106a 106b    104 102
   106

108

110  111

140a  140b

SEMICONDUCTOR DEVICE, METHOD FOR MANUFACTURING THE SAME, AND ETCHANT USED FOR THE SAME

BACKGROUND OF THE INVENTION

1. Field of the Invention

The present invention relates to an object, a method, or a manufacturing method. Further, the present invention relates to a process, a machine, manufacture, or a composition of matter. One embodiment of the present invention relates to a semiconductor device, a display device, a light-emitting device, an electronic device, a manufacturing method thereof, or a driving method thereof. Specifically, one embodiment of the present invention relates to, for example, a semiconductor device using an oxide semiconductor and a method for manufacturing the same. Furthermore, one embodiment of the present invention relates to, for example, an etchant which can be used for a semiconductor device using an oxide semiconductor.

Note that in this specification, a semiconductor device refers to a semiconductor element itself or a device including a semiconductor element. As an example of such a semiconductor element, for example, a transistor (a thin film transistor and the like) can be given. In addition, a display device such as a liquid crystal display device includes a semiconductor device in some cases.

2. Description of the Related Art

There is a trend in a display device using a transistor (e.g., a liquid crystal panel and an organic EL panel) toward a larger screen. As the screen size becomes larger, in the case of a display device using an active element such as a transistor, a voltage applied to an element varies depending on the position of a wiring which is connected to the element due to wiring resistance, which cause a problem of deterioration of display quality such as display unevenness and a defect in grayscale.

Conventionally, an aluminum film has been widely used as a material used for the wiring, the signal line, or the like; moreover, research and development of using a copper film as a material is extensively conducted to further reduce resistance. However, the copper film has poor adhesion to a base film. In addition, diffusion of a copper element in the copper film into a semiconductor layer of a transistor causes degradation in characteristics of the transistor. Note that a silicon-based semiconductor material is widely known as a material for a semiconductor thin film applicable to a transistor, and as another material, an oxide semiconductor has attracted attention (see Patent Document 1).

Furthermore, as a method for manufacturing an array substrate for a TFT-LCD, an etchant containing at least one selected from neutral salt, inorganic acid, and organic acid in addition to hydrogen peroxide which can collectively etch a double metal layer including copper is disclosed (see Patent Document 2).

REFERENCE

Patent Document

[Patent Document 1] Japanese Published Patent Application No. 2007-123861
[Patent Document 2] Japanese Published Patent Application No. 2002-302780

SUMMARY OF THE INVENTION

According to the structure disclosed in Patent Document 2, a double metal layer including molybdenum (Mo) and copper (Cu) is formed over an amorphous silicon layer; then one from neutral salt, inorganic acid, and organic acid is selected; and by using an etchant in which the selected one, hydrogen peroxide, and hydrogen peroxide stabilizer are mixed, the double metal layer is etched collectively to form a source electrode and a drain electrode.

However, the above structure can be only applied to a transistor using an amorphous silicon, that is, a silicon-based semiconductor material as a semiconductor layer; thus, there has been a problem in that the above structure does not have a manufacturing method or an etchant suitable for using a transistor including an oxide semiconductor.

In view of the above problems, an object of one embodiment of the present invention is to provide a novel semiconductor device in which a transistor using an oxide semiconductor film includes a wiring, a signal line, or the like formed using a copper-containing metal film. Another object of one embodiment of the present invention is to provide a method for manufacturing a semiconductor device in which a transistor using an oxide semiconductor film includes a wiring, a signal line, or the like formed using a copper-containing metal film. Another object of one embodiment of the present invention is to provide a novel semiconductor device in which a transistor using an oxide semiconductor film includes a copper-containing metal film with a favorable shape. Another object of one embodiment of the present invention is to provide a novel semiconductor device of which productivity is improved. Another object of one embodiment of the present invention is to provide an etchant which can be used for a transistor using an oxide semiconductor film. Another object of one embodiment of the present invention is to provide a novel semiconductor device and a method for manufacturing the novel semiconductor device.

Note that the descriptions of these objects do not disturb the existence of other objects. In one embodiment of the present invention, there is no need to achieve all the objects. Objects other than the above objects will be apparent from and can be derived from the description of the specification, the drawings, the claims, and the like.

One embodiment of the present invention is a method for manufacturing a semiconductor device including the steps of forming a first conductive film over a substrate; forming an insulating film over the first conductive film; forming an oxide semiconductor film over the insulating film to overlap with the first conductive film; forming a second conductive film including a metal film containing molybdenum as its main component and a metal film containing copper as its main component over the oxide semiconductor film; and etching the second conductive film by an etchant. In the etching step of the second conductive film by the etchant, the oxide semiconductor film is used as an etching stopper film.

Another embodiment of the present invention is a method for manufacturing a semiconductor device including the steps of forming a first conductive film over a substrate; forming an insulating film over the first conductive film; forming an oxide semiconductor film and a metal oxide film over the insulating film to overlap with the first conductive film; forming a second conductive film including a metal film containing molybdenum as its main component and a metal film containing copper as its main component over the metal oxide film; and etching the second conductive film by an etchant. In the etching step of the second conductive film by the etchant, the metal oxide film is used as an etching stopper film.

In each of the above structures, the oxide semiconductor film is preferably formed using an In-M-Zn oxide (M is Ti, Ga, Y, Zr, Sn, La, Ce, Nd, or Hf). Further, in each of the above structures, the metal oxide film is preferably formed using an In-M oxide (M is Ti, Ga, Y, Zr, Sn, La, Ce, Nd, or Hf).

Another embodiment of the present invention is an etchant including an aqueous solution of organic acid and aqueous hydrogen peroxide. The etchant has a function of etching a metal film containing molybdenum as its main component and a metal film containing copper as its main component. The pH of the etchant is greater than or equal to 3 and less than or equal to 6.

In the above structure, provided that the ratio of components of the etchant is aqueous hydrogen peroxide:aqueous solution of organic acid=x:y [wt %], y/(x+y) is preferably greater than or equal to 0.7 and less than or equal to 0.9.

A semiconductor device, a display device, and an electronic device manufactured by a manufacturing method of the semiconductor device having any of the above structures are also included in one embodiment of the present invention.

According to one embodiment of the present invention, a novel semiconductor device in which a transistor using an oxide semiconductor film includes a wiring, a signal line, or the like formed using a copper-containing metal film can be provided. According to another embodiment of the present invention, a method for manufacturing a semiconductor device in which a transistor using an oxide semiconductor film includes a wiring, a signal line, or the like formed using a copper-containing metal film can be provided. According to another embodiment of the present invention, a novel semiconductor device in which a transistor using an oxide semiconductor film includes a copper-containing metal with a favorable shape can be provided. According to another embodiment of the present invention, a novel semiconductor device of which productivity is improved can be provided. According to another embodiment of the present invention, an etchant which can be used for a transistor using an oxide semiconductor film can be provided. According to another embodiment of the present invention, a novel semiconductor device and a method for manufacturing the novel semiconductor device can be provided.

Note that the description of these effects does not disturb the existence of other effects. One embodiment of the present invention does not necessarily achieve all the objects listed above. Other effects will be apparent from and can be derived from the description of the specification, the drawings, the claims, and the like.

DETAILED DESCRIPTION OF THE INVENTION

Figure 1A:
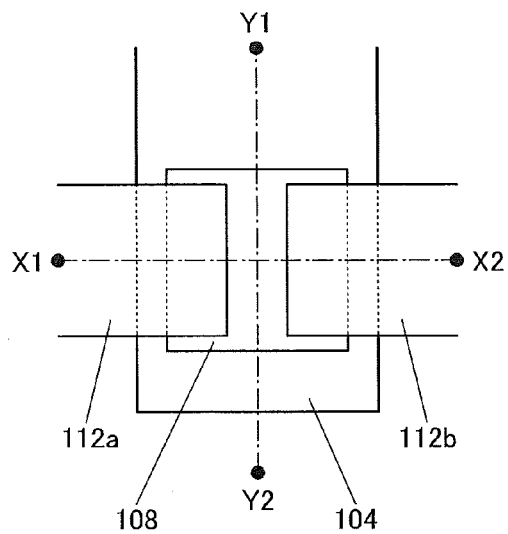
FIGS. 1A to 1C are views illustrating a top view and cross-sectional views of a semiconductor device.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

Note that in this specification, terms for describing arrangement, such as "over" "above", "under", and "below", are used for convenience in describing a positional relation between components with reference to drawings. Furthermore, the positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. In addition, the transistor has a channel region between a drain (a drain terminal, a drain region, or a drain electrode layer) and a source (a source terminal, a source region, or a source electrode layer), and current can flow through the drain, the channel region, and the source. Note that in this specification and the like, a channel region refers to a region through which current mainly flows.

Further, functions of a source and a drain might be switched when transistors having different polarities are employed or a direction of current flow is changed in circuit operation, for example. Therefore, the terms "source" and "drain" can be switched in this specification and the like.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

(Embodiment 1)

In this embodiment, a semiconductor device of one embodiment of the present invention and a method for manufacturing the semiconductor device will be described with reference to FIGS. 1A to 1C, FIGS. 2A to 2D, and FIGS. 3A to 3C.

<Structural Example of Semiconductor Device>

Figure 1B:
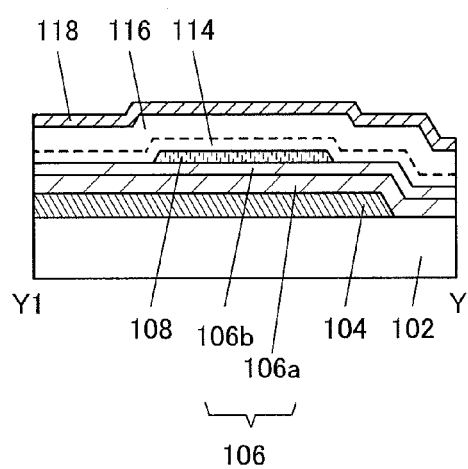
Figure 1C:
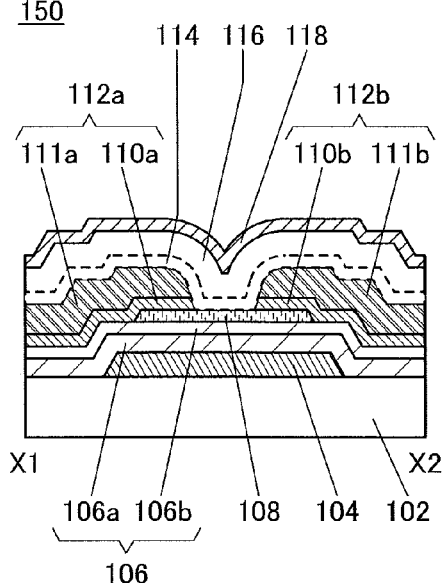

FIG. 1A is a top view of a semiconductor device 150 of one embodiment of the present invention, FIG. 1B is a cross-sectional view taken along a dashed-dotted line Y1-Y2 shown in FIG. 1A, and FIG. 1C is a cross-sectional view taken along a dashed-dotted line X1-X2 shown in FIG. 1A. Note that in FIG. 1A, some components of the semiconductor device 150 (e.g., a gate insulating film) are not illustrated to avoid complexity.

The semiconductor device 150 illustrated in FIGS. 1A to 1C includes a conductive film 104 which functions as a gate electrode layer over the substrate 102, an insulating film 106 which functions as a gate insulating film over the substrate 102 and the conductive film 104, an oxide semiconductor film 108 which overlaps with the conductive film 104 over the insulating film 106, and conductive films 112a and 112b which function as a source electrode layer and a drain electrode layer over the insulating film 106 and the oxide semiconductor film 108. The semiconductor device 150 includes insulating films 114, 116, and 118 functioning as protective insulating films over the oxide semiconductor film 108 and the conductive films 112a and 112b.

In FIGS. 1B and 1C, the insulating film 106 functioning as a gate insulating film has a two-layer structure including insulating films 106a and 106b. Note that the structure of the insulating film 106 is not limited thereto, the insulating film 106 may have a single-layer structure or a stacked-layer structure including three or more layers.

Further, the conductive film 112a which functions as a source electrode layer or a drain electrode layer has a two-layer structure including a conductive film 110a and a conductive film 111a. In addition, the conductive film 112b which functions as a source electrode layer or a drain electrode layer has a two-layer structure including a conductive film 110b and a conductive film 111b. The conductive films 110a and 110b are formed of a metal film containing molybdenum as its main component. The conductive films 111a and 111b are formed of a metal film containing copper as its main component. Note that in this specification and the like, a main component refers to an element contained in composition at 5 atomic % or more.

By employing a two-layer structure including the metal film containing molybdenum as its main component and the metal film containing copper as its main component as described above for the conductive films 112a and 112b which function as a source electrode layer or a drain electrode layer, the following beneficial effects are obtained.

The metal film containing molybdenum as its main component is formed over the oxide semiconductor film 108 as the conductive films 110a and 110b, whereby a favorable ohmic contact with the oxide semiconductor film 108 can be made.

Furthermore, the metal film containing copper as its main component is formed as the conductive films 111a and 111b, whereby the conductive films 111a and 112b can have lower resistance than an aluminum film; thus, the resistance of the conductive films 112a and 112b is reduced, so that signal delay and the like can be suppressed. In addition, by using the metal film containing molybdenum as its main component as the conductive films 110a and 110b, adhesion between the metal film containing copper as its main component which serves as the conductive films 111a and 111b and a base film (here, the insulating film 106b and the oxide semiconductor film 108) can be improved. Further, by using the metal film containing molybdenum as its main component as the conductive films 110a and 110b, manufacturing cost can be lower than that in the case of using a tungsten film or the like.

Note that as one of the characteristics required for the formation of the conductive films 112a and 112b, reduction in manufacturing cost is given. In addition, as other required characteristics, high processability of the conductive films 112a and 112b and less damage to the oxide semiconductor film 108 and the insulating film 106 which serve as a base film of the conductive films 112a and 112b are given.

Here, a method for manufacturing the conductive films 112a and 112b which serve as a source electrode layer and a drain electrode layer of the semiconductor device 150 of one embodiment of the present invention is described below.

<Method for Forming Conductive Film>

In one embodiment of the present invention, an etchant including aqueous solution of organic acid and aqueous hydrogen peroxide is used in the formation of the conductive films 112a and 112b. The etchant etches a molybdenum film and a copper film which serve as the conductive films 112a and 112b, and the pH of the etchant is greater than or equal to 3 and less than or equal to 6. Provided that the ratio of components of the etchant is aqueous hydrogen peroxide: aqueous solution of organic acid=x:y [wt %], y/(x+y) is greater than or equal to 0.7 and less than or equal to 0.9, preferably greater than or equal to 0.8 and less than or equal to 0.85.

The etchant is used at the formation of the conductive films 112a and 112b, whereby at least one of the following required characteristics can be obtained: manufacturing cost, improvement of processability, and suppression of damage to a base film.

In order to manufacture the conductive films 112a and 112b, first, a base film to be a base of the conductive films 112a and 112b is formed. The base film may contain at least one of an oxide semiconductor film which serves as a semiconductor layer of a transistor. Next, a metal film containing molybdenum as its main component is formed as a lower layer film of the conductive films 112a and 112b over the base film, then a metal film containing copper as its main component is formed as an upper layer film of the conductive films 112a and 112b. The metal film containing molybdenum as its main component and the metal film containing copper as its main component are preferably successively formed in vacuum by a sputtering method. Next, a resist mask and the like are patterned in desired regions over the metal film containing copper as its main component that is the upper layer film of the conductive films 112a and 112b. Then, an etchant including an aqueous solution of an organic acid and hydrogen peroxide is applied from above the resist mask.

When the etchant is applied, the metal film containing copper as its main component used as the upper layer film of the conductive films 112a and 112b is etched first. At the time of etching the conductive films 112a and 112b, different kinds of metal films (here, the metal film containing copper as its main component and the metal film containing molybdenum as its main component) are in contact with each other. The standard electrode potential of the metal film containing copper as its main component and that of the metal film containing molybdenum as its main component are different. Thus, in the etchant, a potential difference occurs between a metal having high ionization tendency (here, the metal film containing molybdenum as its main component) and a metal having low ionization tendency (here, the metal film containing copper as its main component). Therefore, the etching rate of the metal film containing molybdenum as its main component is higher than that of the metal film containing copper as its main component, which results in a phenomenon (undercut) in which a metal film containing molybdenum as its main component is positioned on an inner side than the metal film containing copper as its main component might occur.

However, in one embodiment of the present invention, the etchant including an aqueous solution of organic acid and aqueous hydrogen peroxide is used, and the pH of the etchant is greater than or equal to 3 and less than or equal to 6. Furthermore, provided that the ratio of components of the etchant is aqueous hydrogen peroxide:aqueous solution of organic acid=x:y [wt %], y/(x+y) is greater than or equal to 0.7 and less than or equal to 0.9, preferably greater than or equal to 0.8 and less than or equal to 0.85. With such an etchant, the phenomenon (undercut) in which the metal film containing molybdenum as its main component is positioned on the inner side than the metal film containing copper as its main component can be suppressed, and the metal film containing copper as its main component and the metal film containing molybdenum as its main component can be etched collectively. Thus, a semiconductor device with a favorable cross-sectional shape can be obtained.

The base film of the conductive films 112a and 112b is the oxide semiconductor film 108. The oxide semiconductor film 108 serves as an etching stopper film against the etchant. When the etchant has the components described above, the etching rate of the oxide semiconductor film 108 can be lower than those of the conductive films 112a and 112b In this manner, in the semiconductor device of one embodiment of the present invention and the method for manufacturing the semiconductor device, at the formation of the conductive films 112a and 112b, the etchant described above is used and the oxide semiconductor film 108 is used as an etching stopper, whereby a semiconductor device in which the conductive films 112a and 112b have favorable shapes and a method for manufacturing the semiconductor device can be provided.

Next, details of other elements included in the semiconductor device illustrated in FIGS. 1A to 1C are described below.

<Substrate>

There is no particular limitation on the property of a material and the like of the substrate 102 as long as the material has heat resistance enough to withstand at least heat treatment to be performed later. For example, a glass substrate, a ceramic substrate, a quartz substrate, a sapphire substrate, or the like may be used as the substrate 102. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 102. Furthermore, any of these substrates further provided with a semiconductor element may be used as the substrate 102. In the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm) Thus, a large-sized display device can be manufactured. Still further alternatively, a flexible substrate may be used as the substrate 102, and the semiconductor device 150 and the like may be provided directly on the flexible substrate.

Note that in this specification and the like, a transistor can be formed using a variety of substrates. The type of a substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As an example of a glass substrate, a barium borosilicate glass substrate, an aluminoborosilicate glass substrate, a soda lime glass substrate, or the like can be given. Examples of a flexible substrate include a flexible synthetic resin such as plastics typified by polyethylene terephthalate (PET), polyethylene naphthalate (PEN), and polyether sulfone (PES), and acrylic. For an attachment film, polypropylene, polyester, polyvinyl fluoride, polyvinyl chloride, or the like can be used, for example. Examples of the material for the base film include polyester, polyamide, polyimide, inorganic vapor deposition film, and paper. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

Note that a transistor may be formed using one substrate, and then the transistor may be transferred to another substrate. In addition to the above substrates over which the transistor can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, or the like can be used as a substrate to which the transistor is transferred. When such a substrate is used, a transistor with excellent properties or a transistor with low power consumption can be formed, a device with high durability, high heat resistance can be provided, or reduction in weight or thickness can be achieved.

<Oxide Semiconductor Film>

The oxide semiconductor film 108 is formed using an In-M-Zn oxide W is Ti, Ga, Y, Zr, Sn, La, Ce, Nd, or Hf). For the oxide semiconductor film 108, for example, In—Ga—Zn based oxide can be used.

Note that here, for example, an "In—Ga—Zn-based oxide" means an oxide containing In, Ga, and Zn as its main components and there is no limitation on the ratio of In:Ga:Zn. The In—Ga—Zn-based oxide may contain another metal element in addition to In, Ga, and Zn.

<Insulating Film>

As the insulating films 106a and 106b serving as a gate insulating film of the semiconductor device 150, an insulating layer including at least one of the following films formed by a plasma CVD method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film Note that the stacked-layered structure of the insulating films 106a and 106b is not necessarily employed, and an insulating layer with a single-layer structure including any of the above films, or three or more insulating films can be employed.

Note that the insulating film 106b that is in contact with the oxide semiconductor film 108 serving as a channel region of the semiconductor device 150 is preferably an oxide insulating film and preferably has a region (oxygen-excess region) containing oxygen in excess of the stoichiometric composition. In other words, the insulating film 106b is an insulating film capable of releasing oxygen. In order to provide the oxygen-excess region in the insulating film 106b, the insulating film 106b is formed in an oxygen atmosphere, for example. Alternatively, oxygen may be introduced into the deposited insulating film 106b to provide the oxygen-excess region therein. As a method for introducing oxygen, an ion implantation method, an ion doping method, a plasma immersion ion implantation method, plasma treatment, or the like may be employed.

Using hafnium oxide for the insulating films 106a and 106b has the following effects. Hafnium oxide has higher dielectric constant than silicon oxide and silicon oxynitride. Therefore, by using hafnium oxide, a physical thickness can be made larger than an equivalent oxide thickness; thus, even in the case where the equivalent oxide thickness is less than or equal to 10 nm or less than or equal to 5 nm, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to the above examples.

In this embodiment, a silicon nitride film is formed as the insulating film 106a, and a silicon oxide film is formed as the insulating film 106b. In addition, the silicon nitride film has a higher dielectric constant than a silicon oxide film and needs a larger thickness for capacitance equivalent to that of the silicon oxide film. Thus, by providing the silicon nitride film as the gate insulating film in the semiconductor device 150, the physical thickness of the insulating film can be increased. Accordingly, reduction in withstand voltage of the semiconductor device 150 is prevented and the withstand voltage is improved, so that electrostatic breakdown of the semiconductor device 150 can be prevented.

<Conductive Film>

For the conductive films 112a and 112b serving as the source electrode layer and the drain electrode layer of the semiconductor device 150, the conductive films 110a and 111a included in the conductive film 112a, the conductive films 110b and 111b included in the conductive film 112b, materials given below can be used. As the conductive films 110a and 110b, a metal film containing molybdenum as its main component may be used; for example, a molybdenum film, a molybdenum nitride film, an alloy film containing molybdenum as its main component can be used. As the alloy film containing molybdenum as its main component, for example, an alloy film of molybdenum and titanium or an alloy film of molybdenum and tungsten can be used. By using an alloy film of molybdenum and tungsten, heat resistance can be increased. As the typical composition of the alloy film of molybdenum (Mo) and tungsten (W), Mo:W=3:1 [atomic ratio], Mo:W=1:1 [atomic ratio], Mo:W=1:3 [atomic ratio], or the like can be given. In addition, the alloy film of molybdenum (Mo) and tungsten (W) can be formed by a sputtering method using a metal target with a composition of Mo:W=49: 51 [wt %], Mo:W=61:39 [wt %], and Mo:W=14.8:85.2 [wt %]. Further, as the conductive films 111a and 111b, a metal film containing copper as its main component can be used; for example, a copper film or an alloy film containing copper as its main component can be used. Moreover, the conductive films 112a and 112b can be formed by a sputtering method, for example.

<Protective Insulating Film>

As each of the insulating films 114, 116 and 118 serving as a protective insulating film of the semiconductor device 150, an insulating film including at least one of the following films formed by a plasma CVD method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

An insulating film 114 in contact with the oxide semiconductor film 108 serving as a channel region of the semiconductor device 150 is preferably an oxide insulating film, and an insulating film capable of releasing oxygen is used. In other words, the insulating film capable of releasing oxygen is an insulating film including a region (oxygen-excess region) containing oxygen in excess of that in the stoichiometric composition. In order to provide the oxygen-excess region in the insulating film 114, the insulating film 114 is formed in an oxygen atmosphere, for example. Alternatively, oxygen may be introduced into the deposited insulating film 114 to provide the oxygen-excess region therein. As a method for introducing oxygen, an ion implantation method, an ion doping method, a plasma immersion ion implantation method, plasma treatment, or the like may be employed.

The use of the insulating film capable of releasing oxygen as the insulating film 114 can reduce the number of oxygen vacancies in the oxide semiconductor film 108 by transferring oxygen to the oxide semiconductor film 108 serving as a channel region of the semiconductor device 150. For example, the number of oxygen vacancies in the oxide semiconductor film 108 can be reduced by using an insulating film having the following feature: the number of oxygen molecules released from the insulating film by heat treatment at a temperature higher than or equal to 100° C. and lower or equal to 700° C., preferably higher than or equal to 100° C. and lower than or equal to 500° C. is greater than or equal to $1.0 \times 10^{18}$ molecules/cm$^3$ when measured by thermal desorption spectroscopy (hereinafter referred to as TDS).

The thickness of the insulating film 114 can be greater than or equal to 5 nm and less than or equal to 150 nm, preferably greater than or equal to 5 nm and less than or equal to 50 nm, more preferably greater than or equal to 10 nm and less than or equal to 30 nm. The thickness of the insulating film 116 can be greater than or equal to 30 nm and less than or equal to 500 nm, preferably greater than or equal to 150 nm and less than or equal to 400 nm.

Furthermore, the insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, the present invention is not limited to this. For example, a single-layer structure of the insulating film 114, a single-layer structure of the insulating film 116, or a stacked-layer structure including three or more layers may be used.

<Method for Manufacturing Semiconductor Device>

Next, an example of a method for manufacturing the semiconductor device illustrated in FIGS. 1A to 1C is described with reference to FIGS. 2A to 2D and FIGS. 3A to 3C.

First, the conductive film 104 serving as a gate electrode layer is formed over the substrate 102. Then, the insulating film 106 serving as a gate insulating film is formed over the substrate 102 and the conductive film 104. Note that the insulating film 106 includes the insulating films 106a and 106b (see FIG. 2A).

Note that the substrate 102, the conductive film 104, and the insulating films 106a and 106b can be selected from the materials which are described above. In this embodiment, a glass substrate is used as the substrate 102; a stacked-layer structure including a molybdenum film and a copper film is used as the conductive film 104; a silicon nitride film is used as the insulating film 106a; and a silicon oxynitride film capable of releasing oxygen is used as the insulating film 106b.

By providing the silicon nitride film as the insulating film 106a, diffusion of copper element or the like from the copper film used as the conductive film 104 can be prevented.

Figure 2A:
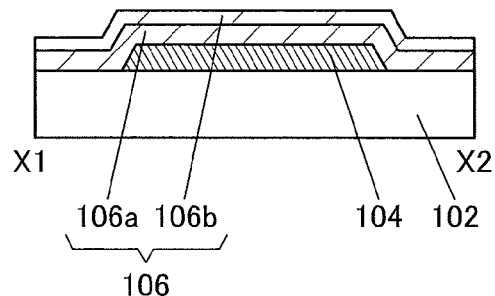
FIGS. 2A to 2D are cross-sectional views illustrating a method for manufacturing a semiconductor device.
Figure 2B:
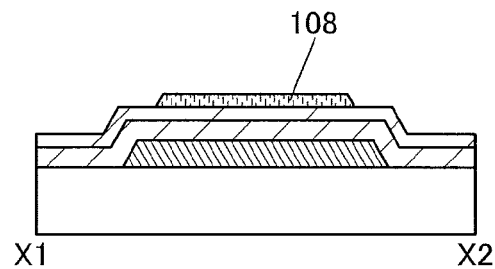

Next, the oxide semiconductor film 108 is formed over the insulating film 106 to overlap with the conductive film 104 (see FIG. 2B).

The oxide semiconductor film 108 can be formed using any of the materials described above. In this embodiment, as the oxide semiconductor film 108, an In—Ga—Zn oxide film, which is formed using a metal oxide target with In:Ga:Zn=1:1:1, is used.

The oxide semiconductor film 108 can be formed in such a manner that an oxide semiconductor film is formed over the insulating film 106, the oxide semiconductor film is patterned so that a desired region thereof remains, and then unnecessary regions are etched.

After formation of the oxide semiconductor film 108, heat treatment is preferably performed. The heat treatment is preferably performed at a temperature of higher than or equal to 250° C. and lower than or equal to 650° C., preferably higher than or equal to 300° C. and lower than or equal to 500° C., more preferably higher than or equal to 350° C. and lower than or equal to 450° C., in an inert gas atmosphere, an atmosphere containing an oxidizing gas at 10 ppm or more, or a reduced pressure atmosphere. Alternatively, the heat treatment may be performed first in an inert gas atmosphere, and then another heat treatment is performed in an atmosphere containing an oxidizing gas at 10 ppm or more in order to compensate oxygen released from the oxide semiconductor film 108. By this heat treatment, impurities such as hydrogen and water can be removed from at least one of the insulating film 106a, the insulating film 106b, and the oxide semiconductor film 108. Note that the above-described heat treatment may be performed before the oxide semiconductor film 108 is processed into an island shape.

Note that stable electrical characteristics can be effectively imparted to the semiconductor device 150 in which the oxide semiconductor film 108 serves as a channel region by reducing the concentration of impurities in the oxide semiconductor film 108 to make the oxide semiconductor film 108 intrinsic or substantially intrinsic.

Figure 2C:
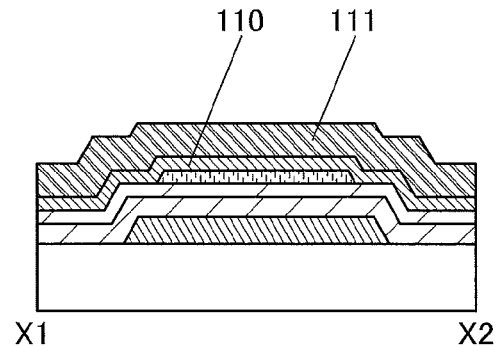

Next, a stacked-layer film of the conductive film 110 and the conductive film 111 is formed over the insulating film 106 and the oxide semiconductor film 108 (see FIG. 2C).

The conductive film 110 can be formed using any of the materials described above as the materials of the conductive films 110a and 110b. In addition, the conductive film 111 can be formed using any of the materials described above as the materials of the conductive films 111a and 111b. In this embodiment, a molybdenum film with a thickness of 10 nm is used as the conductive film 110. Furthermore, a copper film with a thickness of 200 nm is used as the conductive film 111.

Figure 2D:
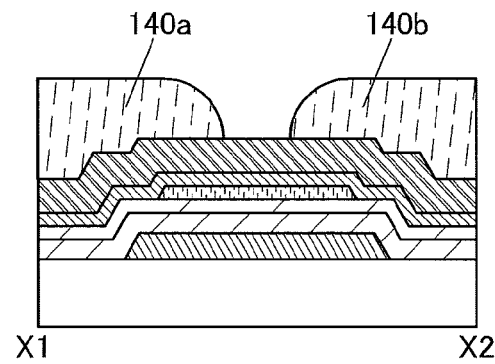

Next, a resist is applied over the conductive film 111 and is patterned, whereby resist masks 140a and 140b are formed in desired regions (see FIG. 2D).

The resist masks 140a and 140b can be formed in such a manner that a photosensitive resin is applied and then is exposed and developed in a desired region. Note that the photosensitive resin may be a negative-type or positive-type photosensitive resin. Alternatively, the resist masks 140a and 140b may be formed by an inkjet method. When the resist masks 140a and 140b are formed by an inkjet method, manufacturing cost can be reduced because a photomask is not used.

Figure 3A:
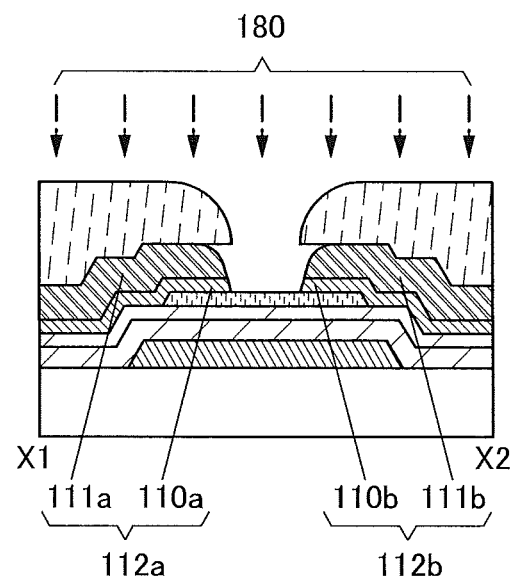
FIGS. 3A to 3C are cross-sectional views illustrating a method for manufacturing a semiconductor device.

Next, an etchant 180 is applied from above the resist masks 140a and 140b, and then the conductive films 111 and 110 are etched, whereby the conductive film 112a including the conductive films 110a and 111a which serves as a source electrode layer and the conductive film 112b including the conductive films 110b and 111b which serves as a drain electrode layer is formed (see FIG. 3A).

The etchant 180 used for etching the conductive films 110 and 111 is an etchant including an aqueous solution of an organic acid and hydrogen peroxide, and the pH of the etchant 180 is greater than or equal to 3 and less than or equal to 6.

Furthermore, provided that the ratio of components of the etchant 180 is aqueous hydrogen peroxide:aqueous solution of organic acid=x:y [wt %], y/(x+y) is greater than or equal to 0.7 and less than or equal to 0.9, preferably greater than or equal to 0.8 and less than or equal to 0.85. With the etchant 180 including such components, a phenomenon in which the molybdenum film is positioned on an inner side than the copper film can be suppressed, whereby a favorable cross-sectional shape can be obtained.

At the time of etching the conductive films 110 and 111, the oxide semiconductor film 108 is used as an etching stopper. When the etchant 180 has the components described above, the etching rate of the oxide semiconductor film 108 can be lower than those of the conductive films 112a and 112b.

Figure 3B:
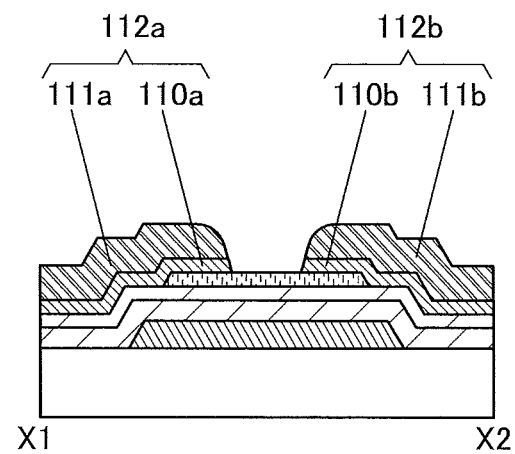

Next, the resist masks 140a and 140b are removed (see FIG. 3B).

The resist masks 140a and 140b can be removed using, for example, a resist peeling apparatus.

Figure 3C:
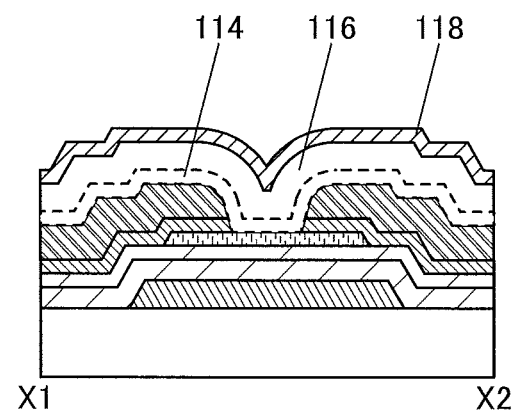

Next, the insulating films 114, 116, and 118 serving as a protective insulating film are formed over the oxide semiconductor film 108, the conductive film 112a and the conductive film 112b (see FIG. 3C).

The insulating films 114, 116 and 118 can be formed using any of the materials described above. In this embodiment, a silicon oxynitride film capable of releasing oxygen is used as the insulating films 114 and 116, and a silicon nitride film is used as the insulating film 118. By using a silicon nitride film, impurities and the like that enter the oxide semiconductor film 108 from the outside can be reduced.

Through the above manufacturing steps, the semiconductor device 150 illustrated in FIGS. 1A to 1C can be manufactured.

The structures, the methods, and the like described in this embodiment can be combined as appropriate with any of the structures, the methods, and the like described in the other embodiments.

(Embodiment 2)

In this embodiment, a semiconductor device and a manufacturing method of the semiconductor device which are different from those in Embodiment 1 are described using FIGS. 4A to 4C and FIGS. 5A to 5C. Note that portions that are similar to the portions in Embodiment 1 are denoted by the same reference numerals, and detailed description thereof is omitted.

<Structure Example (Modification Example 1) of Semiconductor Device>

Figure 4A:
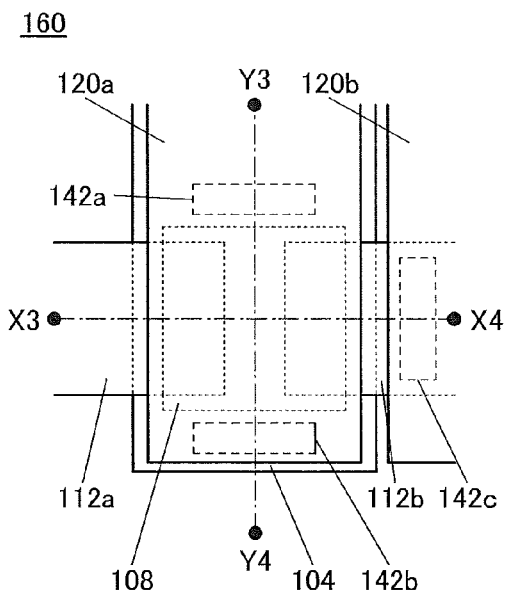
FIG. 4A is a top view of a semiconductor device.
Figure 4B:
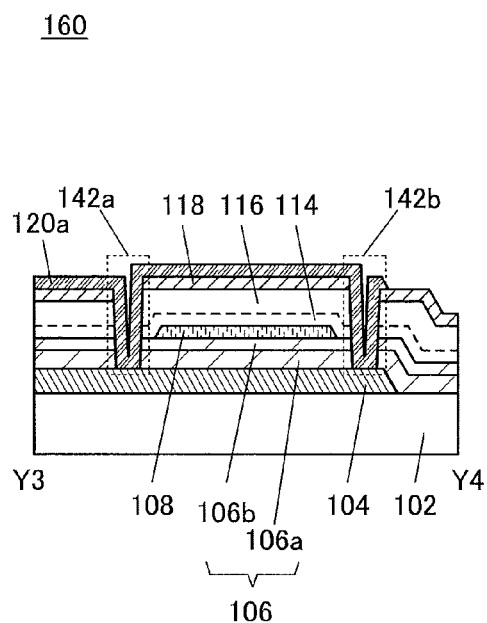
FIGS. 4B and 4C are cross-sectional views thereof.
Figure 4C:
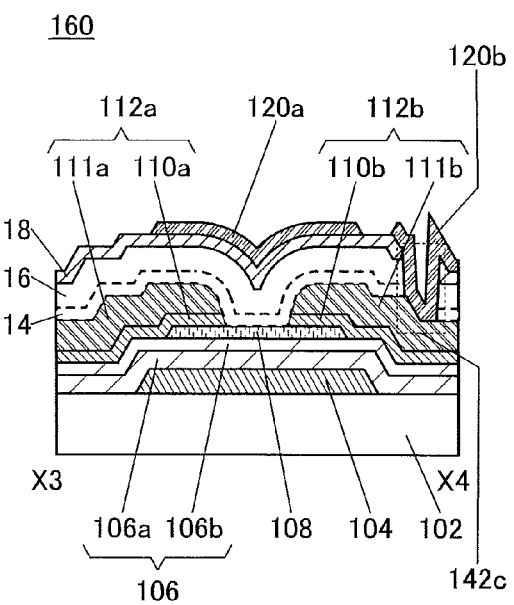

FIG. 4A is a top view of a semiconductor device 160 of one embodiment of the present invention, FIG. 4B is a cross-sectional view take along a dashed-dotted line Y3-Y4 in FIG. 4A, and FIG. 4C is a cross-sectional view take along a dashed-dotted line X3-X4 in FIG. 4A. Note that in FIG. 4A, some components of the semiconductor device 160 (e.g., a gate insulating film) are not illustrated to avoid complexity.

The semiconductor device 160 illustrated in FIGS. 4A to 4C includes the conductive film 104 serving as a gate electrode layer over the substrate 102, the insulating film 106 serving as a gate insulating film over the substrate 102 and the conductive film 104, the oxide semiconductor film 108 overlapping with the conductive film 104 over the insulating film 106, and the conductive films 112a and 112b serving as a source electrode layer and a drain electrode layer over the insulating film 106 and the oxide semiconductor film 108. The semiconductor device 160 also includes the insulating films 114, 116, and 118 functioning as a protective insulating film over the oxide semiconductor film 108 and the conductive films 112a and 112b.

The semiconductor device 160 also includes an opening portion 142c provided in the insulating films 114, 116, and 118, a conductive film 120a over the insulating film 118 in a region overlapping with the oxide semiconductor film 108, and a conductive film 120b provided to fill the opening portion 142c. The conductive film 120a serves as a second gate electrode layer of the semiconductor device 160. Furthermore, as illustrated in FIG. 4B, the conductive film 120a is connected to the conductive film 104 serving as a gate electrode layer through opening portions 142a and 142b provided in the insulating films 106a, 106b, 114, 116, and 118.

Note that the insulating film 106 serves as a first gate insulating film of the semiconductor device 160, and the insulating films 114, 116, and 118 serve as a second gate insulating film of the semiconductor device 160. Furthermore, the conductive film 120b serves as a pixel electrode layer.

In the channel width direction (a direction indicated by a dashed-dotted line Y3-Y4 in FIGS. 4A and 4B) of the semiconductor device 160 in this embodiment, the oxide semiconductor film 108 is provided between the conductive film 104 serving as a gate electrode layer and the conductive film 120a serving as a second gate electrode layer. The insulating film 106 is provided between the conductive film 104 and the oxide semiconductor film 108, and the insulating films 114, 116 and 118 are provided between the oxide semiconductor film 108 and the conductive film 120a.

In the channel width direction (a direction indicated by a dashed-dotted line Y3-Y4 in FIGS. 4A and 4B) of the semiconductor device 160, the conductive film 104 serving as a gate electrode layer and the conductive film 120a serving as a second gate electrode layer surround the oxide semiconductor film 108. The insulating film 106 is provided between the conductive film 104 and the oxide semiconductor film 108, and the insulating films 114, 116 and 118 are provided between the oxide semiconductor film 108 and the conductive film 120a. The conductive film 120a serving as a second gate electrode layer on the side surfaces of the opening portions 142a and 142b faces the side surfaces of the oxide semiconductor film 108.

The semiconductor device 160 has a structure in which the conductive film 104 serving as a gate electrode layer and the conductive film 120a serving as a second gate electrode layer are provided, and the conductive film 104 and the conductive film 120a are electrically connected to each other to have the same potential. Moreover, in the semiconductor device 160, the side surfaces of the oxide semiconductor film 108 face the conductive film 120a, and the conductive film 104 and the conductive film 120a surround the oxide semiconductor film 108 in the channel width direction. The insulating film 106 is provided between the conductive film 104 and the oxide semiconductor film 108, and the insulating films 114, 116 and 118 are provided between the oxide semiconductor film 108 and the conductive film 120a.

With the structure described above, carriers flow in a wide region of the oxide semiconductor film 108 without being limited to the interface between the insulating film 106 (specifically, the insulating film 106b) and the oxide semiconductor film 108 and the interface between the insulating film 114 and the oxide semiconductor film 108, which results in an increase in carrier mobility in the semiconductor device 160.

As a result, the on-state current of the semiconductor device 160 is increased, and the field-effect mobility is increased to greater than or equal to 10 cm$^2$/V·s or to greater than or equal to 20 cm$^2$/V·s, for example. Note that here, the field-effect mobility is not an approximate value of the mobility as the physical property of the oxide semiconductor film but is an index of current drive capability and the apparent field-effect mobility of a saturation region of the transistor. Note that an increase in field-effect mobility becomes significant when the channel length (also referred to as L length) of the transistor is greater than or equal to 0.5 µm and less than or equal to 6.5 µm, preferably greater than 1 µm and less than 6 µm, further preferably greater than 1 µm and less than or equal to 4 µm, still further preferably greater than 1 µm and less than or equal to 3.5 µm, yet still further preferably greater than 1 µm and less than or equal to 2.5 µm. With a short channel length more than or equal to 0.5 µm and less than or equal to 6.5 µm, the channel width can also be short.

Defects are formed at end portions of the oxide semiconductor film 108, which is processed by etching or the like, because of damage due to the processing, and the end portions are polluted by attachment of impurities or the like. For this reason, in the case where only one of the conductive film 104 serving as a gate electrode layer and the conductive film 120a serving as a second gate electrode layer are formed in the semiconductor device 160, even when the oxide semiconductor film 108 is intrinsic or substantially intrinsic, the end portions of the oxide semiconductor film 108 are easily activated to be n-type regions (low-resistance regions) by application of stress such as an electric field.

In the case where the n-type regions are provided between the conductive film 112a serving as a source electrode layer and the conductive film 112b serving as a drain electrode layer, the n-type regions serve as carrier paths, resulting in formation of a parasitic channel in some cases. As a result, drain current with respect to the threshold voltage is gradually increased, so that the threshold voltage of the transistor shifts in the negative direction in some cases. However, as illustrated in FIGS. 4A to 4C, the conductive film 104 serving as a gate electrode layer and the conductive film 120a serving as a second gate electrode layer have the same potential, and the conductive film 120a faces the side surface of the oxide semiconductor film 108 in the channel width direction, whereby an electric field of the conductive film 120a affects the oxide semiconductor film 108 also from the side surface of the oxide semiconductor film 108. As a result, a parasitic channel is prevented from being generated at the side surface of the oxide semiconductor film 108 or the end portions including the side surface and its vicinity. As a result, a transistor which has excellent electrical characteristics such as a sharp increase in the drain current at the threshold voltage is obtained.

Further, an electric field from the outside can be blocked by the conductive film 104 serving as a gate electrode layer and the conductive film 120a serving as a second gate electrode layer; thus, charges of charged particles and the like that are formed between the substrate 102 and the conductive film 104 and over the conductive film 120a do not affect the oxide semiconductor film 108. Thus, degradation due to a stress test (e.g., a negative gate bias temperature (−GBT) stress test in which a negative potential is applied to a gate electrode) can be reduced, and changes in the rising voltages of on-state current at different drain voltages can be suppressed.

The BT stress test is one kind of accelerated test and can evaluate, in a short time, change in characteristics (i.e., a change over time) of transistors, which is caused by long-term use. In particular, the amount of change in threshold voltage of the transistor between before and after the BT stress test is an important indicator when examining the reliability of the transistor. If the amount of change in the threshold voltage between before and after the BT stress test is small, the transistor has higher reliability.

Figure 5A:
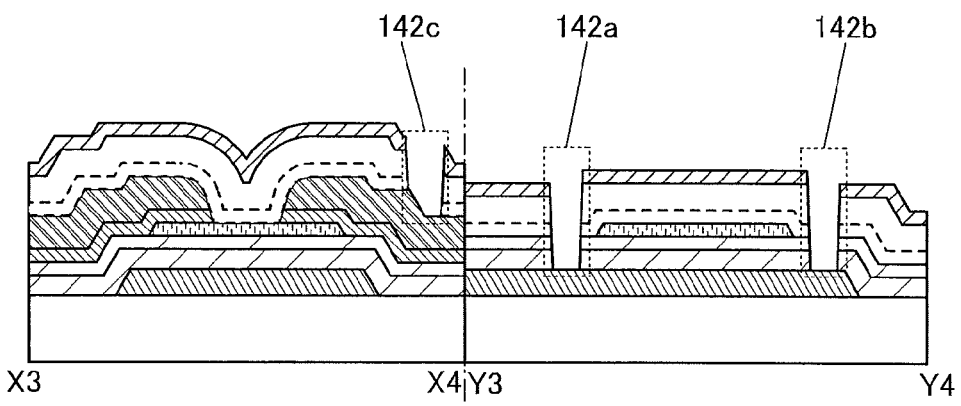
FIGS. 5A to 5C are cross-sectional views illustrating a method for manufacturing a semiconductor device.

Next, a method for manufacturing the semiconductor device 160 is described with reference to FIGS. 5A to 5C. Note that a cross-sectional view in the channel width direction is described with reference to FIGS. 5A to 5C.

<Method for Manufacturing Semiconductor Device (Modification Example 1)>

First, follow the steps up to the step illustrated in FIG. 3C. Then, the opening portions 142a, 142b, and 142c are formed (see FIG. 5A).

The opening portions 142a and 142b reach the conductive film 104. That is, openings are formed in parts of the insulating films 106a, 106b, 114, 116, and 118. The opening portion 142c reaches the conductive film 112b, specifically, the conductive film 111b included in the conductive film 112b. That is, an opening is formed in a part of the insulating films 114, 116, and 118.

The opening portions 142a, 142b, and 142c can be formed in the same step. For example, a pattern is formed with the use of a half-tone mask (or a gray-tone mask, a phase-shift mask, or the like) in a desired region and a dry etching apparatus is used, whereby the opening portions 142a, 142b and 142c can be formed. A half-tone mask or a gray-tone mask may be used as needed. In other words, a half-tone mask or a gray-tone mask does not need to be used. A step of forming the opening portions 142a and 142b may be different from a step of forming the opening portion 142c. Moreover, the opening portions 142a and 142b may formed in two steps. In that case, shapes of the opening portions 142a and 142b may have two stages.

Figure 5B:
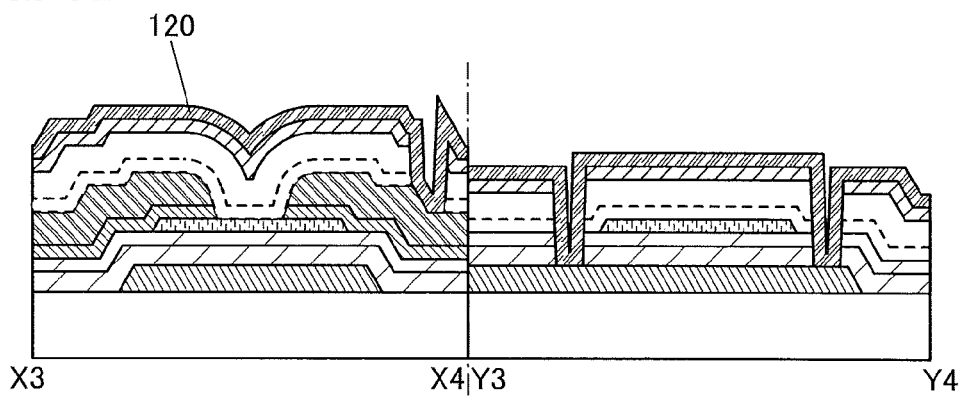

Next, a conductive film 120 is formed over the insulating film 118 so as to cover the opening portions 142a, 142b, and 142c (see FIG. 5B).

For the conductive film 120, for example, a material including one of indium (In), zinc (Zn), and tin (Sn) can be used. In particular, for the conductive film 120, a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added can be used. The conductive film 120 can be formed by a sputtering method, for example.

Figure 5C:
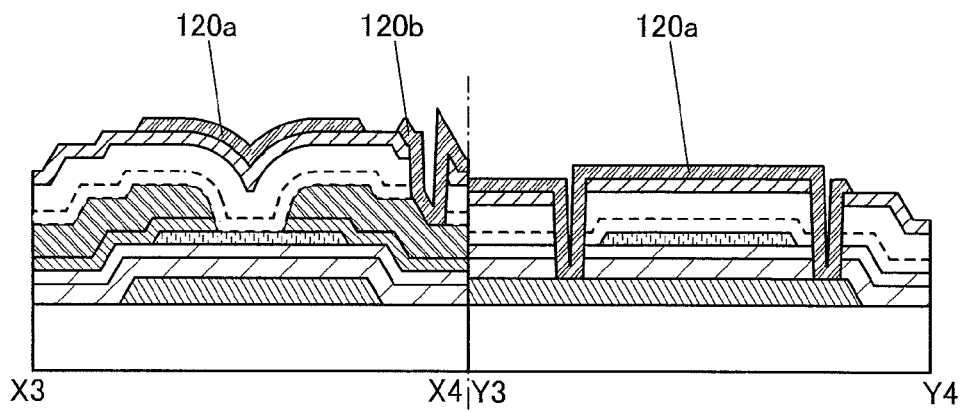

Then, the conductive film 120 is processed into a desired shape, whereby the conductive films 120a and 120b are formed (see FIG. 5C).

To form the conductive films 120a and 120b, one of dry etching and wet etching apparatus or a combination of both of the etching apparatuses is used.

Formation steps of components other than the opening portions 142a, 142b, and 142c and the conductive films 120a and 120b are similar to the formation step of the semiconductor device 150 described in Embodiment 1 and thus are not described here.

Through the above steps, a semiconductor device which includes an oxide semiconductor film can have favorable electrical characteristics. Furthermore, the semiconductor device which includes the oxide semiconductor film can have high reliability.

Figure 11A:
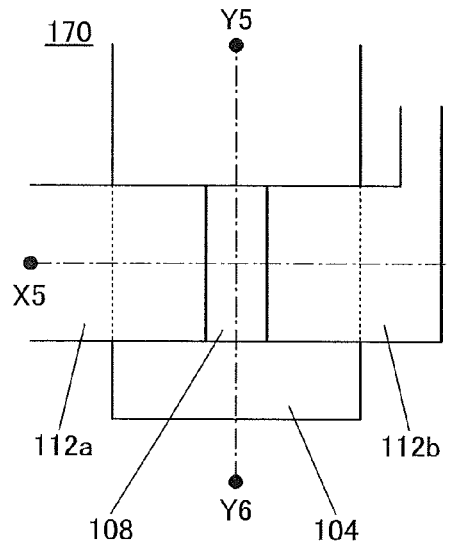
FIG. 11A is a top view of a semiconductor device.
Figure 11B:
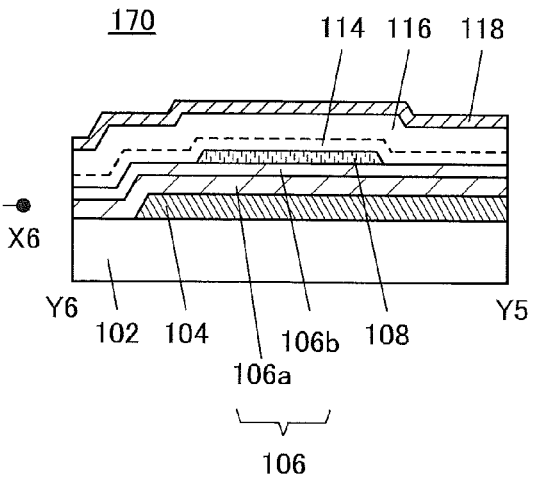
FIGS. 11B to 11D are cross-sectional views thereof.
Figure 11C:
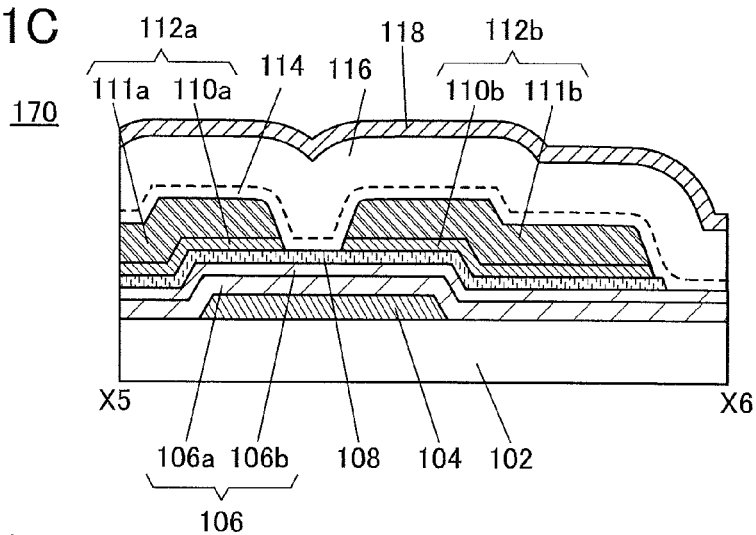
Figure 11D:
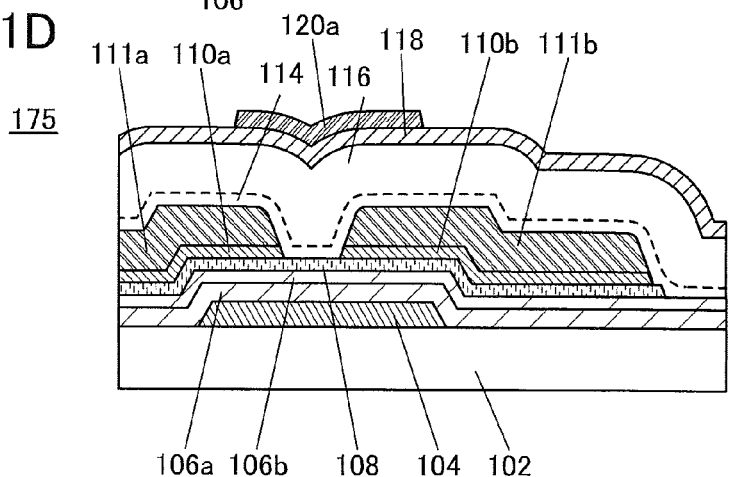

The oxide semiconductor film 108 and the conductive films 112a and 112b may be formed with the use of a half-tone mask (a gray-tone mask, a phrase shift mask) or the like. FIGS. 11A to 11D illustrate examples of such a case. FIG. 11A is a top view of a semiconductor device 170, which is a modification example of the semiconductor device 150 illustrated in FIGS. 1A to 1C. FIG. 11B is a cross-sectional view taken along dashed-dotted line Y5-Y6 in FIG. 11A, and FIG. 11C is a cross-sectional view taken along dashed-dotted line X5-X6 in FIG. 11A. FIG. 11D is a cross-sectional view of a semiconductor device 175, which is a modification example of the semiconductor device 170 in FIG. 11C. The semiconductor device 175 is different from the semiconductor in that the conductive film 120a is provided over the insulating film 118 so as to overlap with the oxide semiconductor film 108.

As illustrated in FIGS. 11A to 11D, in the case where the oxide semiconductor film 108 and the conductive films 112a and 112b are formed by using a half-tone mask (a gray-tone mask, a phase-shift mask) or the like, the oxide semiconductor film 108 is positioned under the conductive films 112a and 112b.

Figure 12A:
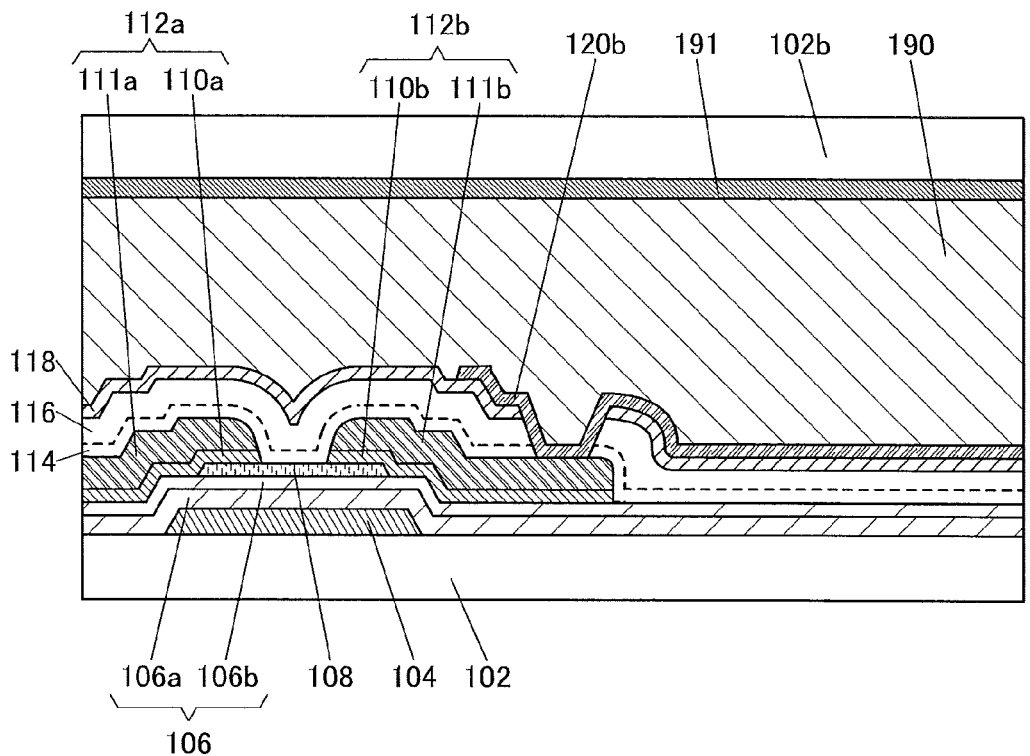
FIGS. 12A and 12B illustrate cross sections of a display device.

As illustrated in FIG. 12A, by providing a liquid crystal layer 190, a common electrode 191, and a substrate 102b over the conductive film 120b, a liquid crystal display device can be obtained. For the liquid crystal layer 190, for example, a nematic liquid crystal material or a cholesteric liquid crystal can be used. As a material used for the liquid crystal layer 190, for example, a polymer dispersed liquid crystal (PDLC), a polymer network liquid crystal, or the like may be used. For the common electrode 191, for example, a material that can be used for the conductive film 120a can be used. For the substrate 102b, a material that can be used for the substrate 102 can be used.

Although not illustrated in FIG. 12A, if necessary, a coloring layer (a colored layer or a color filter), an alignment film or an optical film such as a polarizing plate, a circularly polarizing plate, an elliptically polarizing plate, or a retardation plate (a quarter-wave plate or a half-wave plate) may be provided as appropriate. Further, a polarizing plate or a circularly polarizing plate may be provided with an anti-reflection film. For example, anti-glare treatment by which reflected light can be diffused by projections and depressions on the surface so as to reduce the glare can be performed.

Figure 12B:
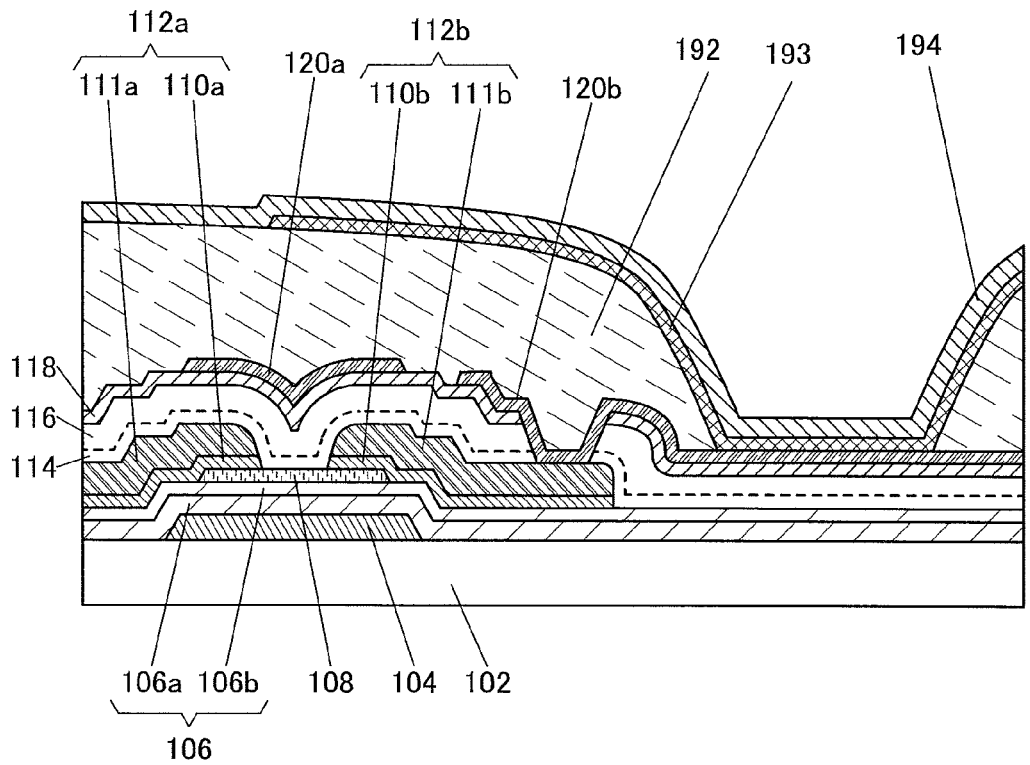

As shown in FIG. 12B, an organic EL layer 193, an insulating film 192, a common electrode 194, and the like are provided, whereby a light-emitting device can be obtained. For the organic EL layer 193, for example, a light-emitting material can be used. For the insulating film 192, for example, an organic resin such as a polyimide resin, an acrylic resin, a polyamide resin, or an epoxy resin or an inorganic insulating material can be used. It is particularly preferable that the insulating film 192 be formed using a photosensitive resin material to have an opening portion so that a sidewall of the opening portion can have a slope with a continuous curvature. For the common electrode 194, for example, a material that can be used for the conductive film 104 or the conductive film 120a can be used. As described above, the most suitable structure is applied over the conductive film 120b as appropriate, so that various display devices can be manufactured.

For example, in this specification and the like, a display element, a display device which is a device including a display element, a light-emitting element, and a light-emitting device which is a device including a light-emitting element can employ various modes and can include various elements. Examples of a display element, a display device, a light-emitting element, or a light-emitting device include an EL (electroluminescent) element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a display device using a micro electro mechanical system (MEMS), a digital micromirror device (DMD), a digital micro shutter (DMS), an interferometric modulator display (IMOD), an electrowetting element, a piezoelectric ceramic display, and a carbon nanotube, which are display media whose contrast, luminance, reflectivity, transmittance, or the like is changed by electromagnetic action. Note that examples of display devices having EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper.

Figure 13:
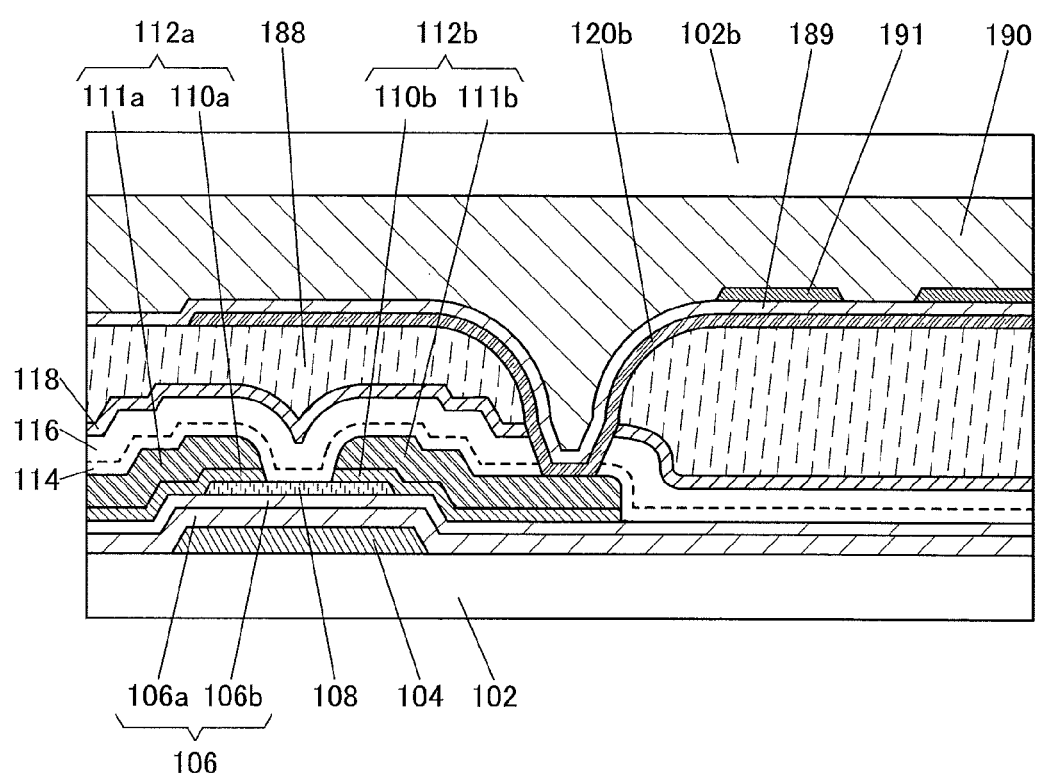
FIG. 13 illustrates a cross section of a display device.

An insulating film 188 functioning as a planarization film may be formed over the insulating film 118 as illustrated in FIG. 13. As shown in FIG. 13, the following structure can be applied: the conductive film 120b is provided over the insulating film 188, an insulating film 189 is provided to cover the insulating film 188 and the conductive film 120b, the common electrode 191 is provided so as to overlap with the conductive film 120b over the insulating film 189, the liquid crystal layer 190 is provided over the insulating film 189 and the common electrode 191, and the substrate 102b is provided over the liquid crystal layer 190. For the insulating film 188 functioning as a planarization film, for example, a material which can be used for the insulating film 192 can be used. Furthermore, for the insulating film 189, for example, a material that can be used for an insulating film 106 can be applied. With a structure illustrated in FIG. 13, for example, the semiconductor device of one embodiment of the present invention and a method for manufacturing the semiconductor device can be applied to a transverse electric field mode (e.g., an IPS mode and an FFS mode) liquid crystal display device.

In this embodiment, an example in which an oxide semiconductor is included in a channel region of a transistor is described. However, one embodiment of the present invention is not limited thereto. Depending on cases or conditions, regions such as a channel region, source and drain regions, and/or a LDD region may include a semiconductor including silicon, germanium, or the like. In the case of using silicon, amorphous silicon, polysilicon, single crystal silicon, or the like may be included.

Note that the structures, methods, and the like described in this embodiment can be used as appropriate in combination with any of the structures, methods, and the like described in the other embodiments.

(Embodiment 3)

In this embodiment, a semiconductor device and a manufacturing method of the semiconductor device which are different from those in Embodiment Tare described using FIGS. 6A to 6D. Note that portions that are similar to those in Embodiment 1 are denoted by the same reference numerals, and detailed description thereof is omitted.

<Structural Example of Semiconductor Device (Modification Example 2)>

Figure 6A:
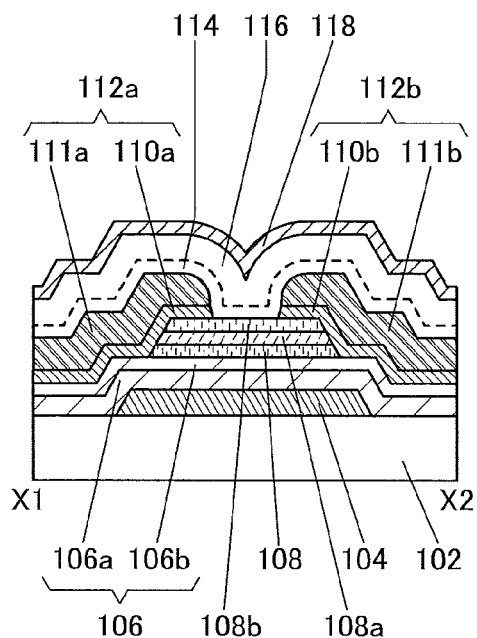
FIGS. 6A and 6B are cross sectional views of semiconductor devices.
Figure 6B:
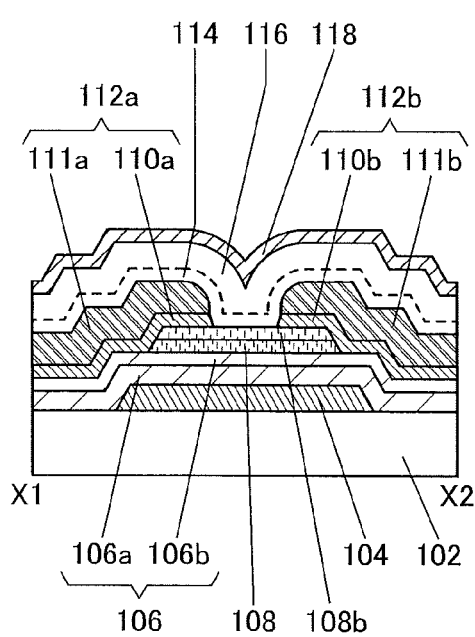

FIGS. 6A and 6B show modification examples of the cross sectional view illustrated in FIG. 1C of Embodiment 1.

A semiconductor device in FIG. 6A has a structure in which a stack including the oxide semiconductor film 108, a metal oxide film 108a, and a metal oxide film 108b is used as the oxide semiconductor film 108 of the semiconductor device 150 illustrated in FIG. 1C. The metal oxide film 108a is formed on and in contact with the oxide semiconductor film 108, and the metal oxide film 108b is formed on and in contact with the metal oxide film 108a.

A semiconductor device illustrated in FIG. 6B has a structure in which a stack including the oxide semiconductor film 108 and the metal oxide film 108b is used as the oxide semiconductor film 108 of the semiconductor device 150 illustrated in FIG. 1C. Note that the metal oxide film 108b is formed on and in contact with the oxide semiconductor film 108.

The metal oxide films 108a and 108b serve as barrier films for preventing diffusion of constituent elements of the conductive films 112a and 112b into the oxide semiconductor film 108.

For the oxide semiconductor film 108, for example, a material described in Embodiment 1, which is formed using an In-M-Zn oxide (M is Ti, Ga, Y, Zr, Sn, La, Ce, Nd, or Hf), is used. For the metal oxide film 108a, a material that is formed using an In-M-Zn oxide is used. For the metal oxide film 108b, a material that is formed using an In-M oxide is used.

In the manufacturing step of the conductive films 112a and 112b serving as a source electrode layer and a drain electrode layer, the metal oxide film 108b serves as an etching stopper film against an etchant Thus, in a structure including the metal oxide film 108b, damage to the oxide semiconductor film 108 caused by etching is reduced. In addition, in a structure including the metal oxide film 108b, constituent elements of the conductive films 112a and 112b can be prevented from diffusing into the oxide semiconductor film 108. Accordingly, a highly reliable semiconductor device can be provided.

In the step of forming the conductive films 112a and 112b serving as a source electrode layer and a drain electrode layer, the etchant described in Embodiment 1 can be used. When the etchant contains the components described above, the etching rate of the metal oxide film 108b is lower than that of the conductive films 112a and 112b.

Figure 6C:
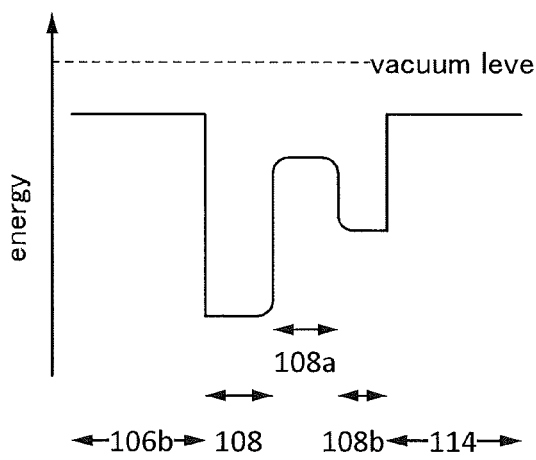
FIGS. 6C and 6D are energy band diagrams of a stacked-layer film.

Here, FIG. 6C shows an example of a band structure in the thickness direction of a stacked-layer structure including the insulating film 106b, the oxide semiconductor film 108, the metal oxide film 108a, the metal oxide film 108b, and the insulating film 114 illustrated in FIG. 6A. In addition, FIG. 6D shows an example of a band structure in the thickness direction of a stacked-layer structure including the insulating film 106b, the oxide semiconductor film 108, the metal oxide film 108b, and the insulating film 114 illustrated in FIG. 6B.

For easy understanding, the band structure shows the energy (Ec) at the bottom of the conduction band of each of the insulating film 106b, the oxide semiconductor film 108, the metal oxide films 108a and 108b, and the insulating film 114.

As illustrated in FIG. 6C, the energy at the bottom of the conduction band smoothly varies between the oxide semiconductor film 108, the metal oxide film 108a, and the metal oxide film 108b. In other words, the energy level at the bottom of the conduction band is continuously varied or continuously connected. To obtain such a band structure, there exists no impurity, which forms a defect state such as a trap center or a recombination center for the oxide semiconductor, at the interface between the oxide semiconductor film 108 and the metal oxide film 108a, and the interface between the metal oxide film 108a and the metal oxide film 108b.

Figure 6D:
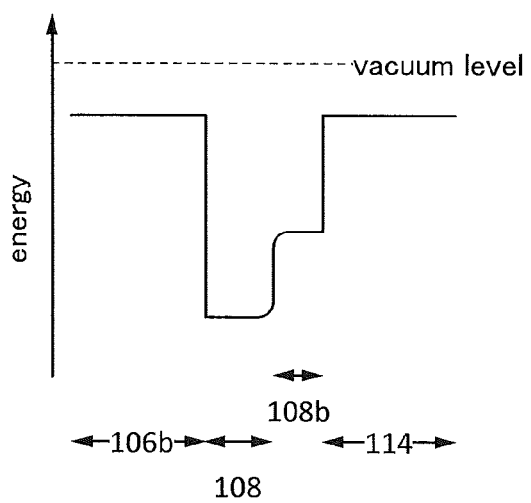

As illustrated in FIG. 6D, the energy at the bottom of the conduction band smoothly varies between the oxide semiconductor film 108 and the metal oxide film 108b. In other words, the energy level of the bottom of the conduction band is continuously changed or continuously connected. To obtain such a band structure, there exists no impurity, which forms a defect state such as a trap center or a recombination center for the oxide semiconductor, at the interface between the oxide semiconductor film 108 and the metal oxide film 108b.

To form a continuous junction between the oxide semiconductor film 108, the metal oxide film 108a, and the metal oxide film 108b, or a continuous junction between the oxide semiconductor film 108 and the metal oxide film 108b, it is necessary to form the films successively without being exposed to the air by using a multi-chamber deposition apparatus (sputtering apparatus) provided with a load lock chamber.

With the band structure of FIG. 6C or FIG. 6D, the oxide semiconductor film 108 serves as a well, and a channel region is formed in the oxide semiconductor film 108 in the transistor with the stacked-layer structure.

By providing the metal oxide film 108a and/or the metal oxide film 108b, the oxide semiconductor film 108 can be distanced away from trap states.

When a voltage is applied to each of the semiconductor devices illustrated in FIGS. 6A and 6B, the energy (Ec) at the bottom of the conduction band of each structure varies. Accordingly, a trap state might be more distant from the vacuum level than the energy (Ec) at the bottom of the conduction band of the oxide semiconductor film 108 serving as a channel region, so that electrons are likely to be accumulated in the trap state. When the electrons are accumulated in the trap state, it becomes a negative fixed electric charge, in which case the threshold voltage of the transistor is shifted to the positive side. Therefore, a trap state is preferably closer to the vacuum level than the energy (Ec) at the bottom of the conduction band of the oxide semiconductor film 108 even in a state where a voltage is applied to the semiconductor device illustrated in FIGS. 6A and 6B. As a result, electrons are less likely to be accumulated in the trap state. Accordingly, the on-state current of the transistor can be increased, and the field effect mobility can be increased.

In FIGS. 6A and 6C, the energy at the bottom of the conduction band of the metal oxide film 108a is closer to the vacuum level than that of the oxide semiconductor film 108. Typically, a difference between the energy at the bottom of the conduction band of the oxide semiconductor film 108 and the energy at the bottom of the conduction band of the metal oxide film 108a is greater than or equal to 0.15 eV or greater than or equal to 0.5 eV, and less than or equal to 2 eV or less than or equal to 1 eV. That is, the difference between the electron affinity of the metal oxide film 108a and the electron affinity of the oxide semiconductor film 108 is greater than or equal to 0.15 eV or greater than or equal to 0.5 eV, and less than or equal to 2 eV or less than or equal to 1 eV.

In such a structure, the oxide semiconductor film 108 serves as a main path of current and functions as a channel region when a voltage is applied to the semiconductor device in FIG. 6A. In addition, since the metal oxide film 108a contains one or more metal elements constituting the oxide semiconductor film 108 in which a channel region is formed, interface scattering is less likely to occur at the interface between the oxide semiconductor film 108 and the metal oxide film 108a. Thus, the transistor can have high field-effect mobility because the movement of carriers is not hindered at the interface.

In FIGS. 6A to 6D, to prevent the metal oxide film 108b from functioning as part of a channel region, a material having sufficiently low conductivity is used for the metal oxide film 108b. Alternatively, for the metal oxide film 108b, a material which has smaller electron affinity (energy difference between the vacuum level and the bottom of the conduction band) than the oxide semiconductor film 108 and has a difference in energy at the bottom of the conduction band from the oxide semiconductor film 108 (i.e., has a band offset) is used. Furthermore, to inhibit generation of a difference between threshold voltages due to the value of the drain voltage, a material of the metal oxide film 108b is preferably selected so that the energy at the bottom of the conduction band is closer to the vacuum level than the energy at the bottom of the conduction band of the oxide semiconductor film 108 is by 0.2 eV or more, preferably 0.5 eV or more.

It is preferable that the metal oxide film 108b not have a spinel crystal structure. This is because if the metal oxide film 108b has a spinel crystal structure, a constituent element of the conductive films 112a and 112b might be diffused into the oxide semiconductor film 108 at the interface between the spinel crystal structure and another region.

The thickness of the metal oxide film 108b is greater than or equal to a thickness that is capable of inhibiting diffusion of the constituent element of the conductive films 112a and 112b into the oxide semiconductor film 108, and less than a thickness that inhibits supply of oxygen from the insulating film 114 to the oxide semiconductor film 108. For example, when the thickness of the metal oxide film 108b is greater than or equal to 10 nm, the constituent elements of the conductive films 112a and 112b can be prevented from diffusing into the oxide semiconductor film 108. When the thickness of the metal oxide film 108b is less than or equal to 100 nm, oxygen can be effectively supplied from the insulating films 114 and 116 to the oxide semiconductor film 108.

Note that as shown in FIG. 6C, the energy at the bottom of the conduction band of the metal oxide film 108a is preferably closer to the vacuum level than that of the metal oxide film 108b.

When the metal oxide film 108a is formed of an In-M-Zn oxide in which the atomic ratio of the element M (M is Ti, Ga, Y, Zr, La, Ce, Nd, or Hf) is higher than that of In, the energy gap of the metal oxide film 108a can be large and the electron affinity of the metal oxide film 108a can be small. Therefore, a difference in electron affinity between the oxide semiconductor film 108 and the metal oxide film 108a may be controlled by the proportion of the element M. Furthermore, oxygen vacancy is less likely to be generated in the metal oxide film 108a in which the atomic ratio of Ti, Ga, Y, Zr, La, Ce, Nd, or Hf is higher than that of In because Ti, Ga, Y, Zr, La, Ce, Nd, and Hf each are a metal element that is strongly bonded to oxygen.

When an In-M-Zn oxide is used for the metal oxide film 108a, the proportions of In and m, not taking Zn and O into consideration, are preferably as follows: the proportion of In is less than 50 at. % and the proportion of M is greater than or equal to 50 at. %; further preferably, the proportion of In is less than 25 at. % and the atomic percentage of M is greater than or equal to 75 at. %.

Further, in the case where each of the oxide semiconductor film 108 and the metal oxide film 108a is formed of an In-M-Zn oxide (M represents Ti, Ga, Y, Zr, Sn, La, Ce, Nd, or Hf), the proportion of M (M represents Ti, Ga, Y, Zr, Sn, La, Ce, Nd, or Hf) in the metal oxide film 108a is larger than that in the oxide semiconductor film 108. Typically, the proportion of M in the metal oxide film 108a is 1.5 or more times, preferably twice or more, more preferably three or more times as large as that in the oxide semiconductor film 108.

Furthermore, in the case where the oxide semiconductor film 108 and the metal oxide film 108a are each formed of an In-M-Zn oxide (M is Ti, Ga, Y, Zr, Sn, La, Ce, Nd, or Hf), when In:M:Zn=$x_1$:$y_1$:$z_1$[atomic ratio] is satisfied in the oxide semiconductor film 108 and In:M:Zn=$x_2$:$y_2$:$z_2$[atomic ratio] is satisfied in the metal oxide film 108a, $y_2/x_2$ is larger than $y_1/x_1$, preferably $y_2/x_2$ is 1.5 or more times as large as $y_1/x_1$, further preferably, $y_2/x_2$ is two or more times as large as $y_1/x_1$, still further preferably $y_2/x_2$ is three or more times or four or more times as large as $y_1/x_1$. In that case, it is preferable that, in the oxide semiconductor film 108, $y_1$ be larger than or equal to $x_1$ because the transistor including the oxide semiconductor film 108 can have stable electric characteristics. However, when $y_1$ is three or more times as large as $x_1$, the field-effect mobility of the transistor including the oxide semiconductor film 108 is reduced. Accordingly, $y_1$ is preferably smaller than three times $x_1$.

In the case where the oxide semiconductor film 108 is formed of an In-M-Zn oxide (M is Ti, Ga, Y, Zr, Sn, La, Ce, Nd, or Hf) and a target having the atomic ratio of metal elements of In:M:Zn=$x_1$:$y_1$:$z_1$ is used for depositing the oxide semiconductor film 108, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a c-axis aligned crystalline oxide semiconductor (CAAC-OS) film to be described later as the oxide semiconductor film 108 is easily formed. Typical examples of the atomic ratio of the metal elements of the target are In:M:Zn=1:1:1, In:M:Zn=1:1:1.2, In:M:Zn=3:1:2, In:M:Zn=4:2:4.1, and the like.

In the case where the metal oxide film 108a is formed of an In-M-Zn oxide (M is Ti, Ga, Y, Zr, Sn, La, Ce, Nd, or Hf) and a target having the atomic ratio of metal elements of In:M:Zn=$x_2$:$y_2$:$z_2$ is used for depositing the metal oxide film 108a, $x_2/y_2$ is preferably less than $x_1/y_1$, and $z_2/y_2$ is preferably greater than or equal to ⅓ and less than or equal to 6, further preferably greater than or equal to 1 and less than or equal to 6. When the atomic ratio of M with respect to indium is high, the energy gap of the metal oxide film 108a can be large and the electron affinity thereof can be small; therefore, $y_2/x_2$ is preferably greater than or equal to 3 or greater than or equal to 4. Typical examples of the atomic ratio of the metal elements of the target include In:M:Zn=1:3:2, In:M:Zn=1:3:4, In:M:Zn=1:3:5, In:M:Zn=1:3:6, In:M:Zn=1:4:2, In:M:Zn=1:4:4, and In:M:Zn=1:4:5, and the like.

Further, in the case where the metal oxide film 108b is formed of an In-M oxide (M is Ti, Ga, Y, Zr, Sn, La, Ce, Nd, or Hf), a divalent metal element (e.g., zinc) is not contained as M, whereby the metal oxide film 108b which does not include a spinel crystal structure can be formed. For the metal oxide film 108b, for example, an In—Ga oxide can be used. The In—Ga oxide can be formed by a sputtering method using an In—Ga metal oxide target (In:Ga=7:93), for example. To deposit the metal oxide film 108b by a sputtering method using DC discharge, on the assumption that an atomic ratio of In:M is x:y, it is preferable that y/(x+y) be less than or equal to 0.96, further preferably less than or equal to 0.95, for example, 0.93.

Note that the atomic ratio of each of the oxide semiconductor film 108, the metal oxide film 108a, and the metal oxide film 108b varies within a range of ±40% of that in the above atomic ratio as an error.

Note that the structures, methods, and the like described in this embodiment can be used as appropriate in combination with any of the structures, methods, and the like described in the other embodiments.

(Embodiment 4)

An oxide semiconductor film that can be used for the semiconductor device of one embodiment of the present invention and that can be formed in the method for manufacturing the semiconductor device will be described in detail in this embodiment.

<Structure of Oxide Semiconductor Film>

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a shape reflecting a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly also includes the case where the angle is greater than or equal to 85° and less than or equal to 95°.

Most of the crystal parts included in the CAAC-OS film each fit inside a cube whose one side is less than 100 nm Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 $nm^2$ or more, 5 $\mu m^2$ or more, or 1000 $\mu m^2$ or more is observed in some cases in the plan TEM image.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when $2\theta$ is around 56°. This peak is derived from the (110) plane of the $InGaZnO_4$ crystal. Here, analysis ($\phi$ scan) is performed under conditions where the sample is rotated around a normal vector of a sample surface as an axis (0 axis) with $2\theta$ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when $\phi$ scan is performed with $2\theta$ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film Thus, for example, in the case where a shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Furthermore, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appears at around 31° and a peak of $2\theta$ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

In an image obtained with the TEM, crystal parts cannot be found clearly in the microcrystalline oxide semiconductor film in some cases. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image obtained with TEM, a crystal grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the diameter of a crystal part, a peak which shows a crystal plane does not appear. Further, a halo pattern is shown in a selected-area electron diffraction pattern of the nc-OS film obtained by using an electron beam having a probe diameter larger than the diameter of a crystal part (e.g., larger than or equal to 50 nm). Meanwhile, spots are shown in a nanobeam electron diffraction pattern of the nc-OS film obtained by using an electron beam having a probe diameter (e.g., larger than or equal to 1 nm and smaller than or equal to 30 nm) close to, or smaller than the diameter of a crystal part. Further, in a nanobeam electron diffraction pattern of the nc-OS film, regions with high luminance in a circular (ring) pattern are observed in some cases. Also in a nanobeam electron diffraction pattern of the nc-OS film, a plurality of spots are shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stacked film including two or more kinds of an amorphous oxide semiconductor film, a microcrystalline oxide semiconductor film, and a CAAC-OS film, for example.

Note that the structures, methods, and the like described in this embodiment can be used as appropriate in combination with any of the structures, methods, and the like described in the other embodiments.

(Embodiment 5)

In this embodiment, a display device to which the semiconductor device of one embodiment of the present invention and the method for manufacturing the semiconductor device can be applied will be described with reference to FIGS. 7A and 7B.

The display device illustrated in FIG. 7A includes a region including pixels of display elements (hereinafter the region is referred to as a pixel portion 302), a circuit portion being provided outside the pixel portion 302 and including a circuit for driving the pixels (hereinafter the portion is referred to as a driver circuit portion 304), circuits each having a function of protecting an element (hereinafter the circuits are referred to as protection circuits 306), and a terminal portion 307. Note that the protection circuits 306 are not necessarily provided.

A part or the whole of the driver circuit portion 304 is preferably formed over a substrate over which the pixel portion 302 is formed. Thus, the number of components and the number of terminals can be reduced. When a part or the whole of the driver circuit portion 304 is not formed over the substrate over which the pixel portion 302 is formed, the part or the whole of the driver circuit portion 304 can be mounted by chip on glass (COG) or tape automated bonding (TAB).

The pixel portion 302 includes circuits for driving a plurality of display elements in X rows (X is a natural number of 2 or more) and Y columns (Y is a natural number of 2 or more) (hereinafter, such circuits are referred to as pixel circuits 301). The driver circuit portion 304 includes driver circuits such as a circuit for supplying a signal (scan signal) to select a pixel (hereinafter the circuit is referred to as a gate driver 304a) and a circuit for supplying a signal (data signal) to drive a display element in a pixel (hereinafter, the circuit is referred to as a source driver 304b).

The gate driver 304a includes a shift register or the like. The gate driver 304a receives a signal for driving the shift register through the terminal portion 307 and outputs a signal. For example, the gate driver 304a receives a start pulse signal, a clock signal, or the like and outputs a pulse signal. The gate driver 304a has a function of controlling the potentials of wirings supplied with scan signals (hereinafter, such wirings are referred to as scan lines GL_1 to GL_X). Note that a plurality of gate drivers 304a may be provided to control the scan lines GL_1 to GL_X separately. Alternatively, the gate driver 304a has a function of supplying an initialization signal. Without being limited thereto, the gate driver 304a can supply another signal.

The source driver 304b includes a shift register or the like. The source driver 304b receives a signal (video signal) from which a data signal is derived, as well as a signal for driving the shift register, through the terminal portion 307. The source driver 304b has a function of generating a data signal to be written in the pixel circuits 301 based on the video signal. In addition, the source driver 304b has a function of controlling output of a data signal in response to a pulse signal produced by input of a start pulse signal, a clock signal, or the like. Furthermore, the source driver 304b has a function of controlling the potentials of wirings supplied with data signals (hereinafter such wirings are referred to as data lines DL_1 to DL_Y). Alternatively, the source driver 304b has a function of supplying an initialization signal. Without being limited thereto, the source driver 304b can supply another signal.

The source driver 304b includes a plurality of analog switches or the like, for example. The source driver 304b can output, as the data signals, signals obtained by time-dividing the video signal by sequentially turning on the plurality of analog switches. The source driver 304b may be formed using a shift register or the like.

A pulse signal and a data signal are input to each of the plurality of pixel circuits 301 through one of the plurality of scan lines GL supplied with scan signals and one of the plurality of data lines DL supplied with data signals, respectively. Writing and holding of the data signal in each of the plurality of pixel circuits 301 are performed by the gate driver 304a. For example, to the pixel circuit 301 in the m-th row and the n-th column (m is a natural number of less than or equal to X, and n is a natural number of less than or equal to Y), a pulse signal is input from the gate driver 304a through the scan line GL_m, and a data signal is input from the source driver 304b through the data line DL_n in accordance with the potential of the scan line GL_m.

Figure 7A:
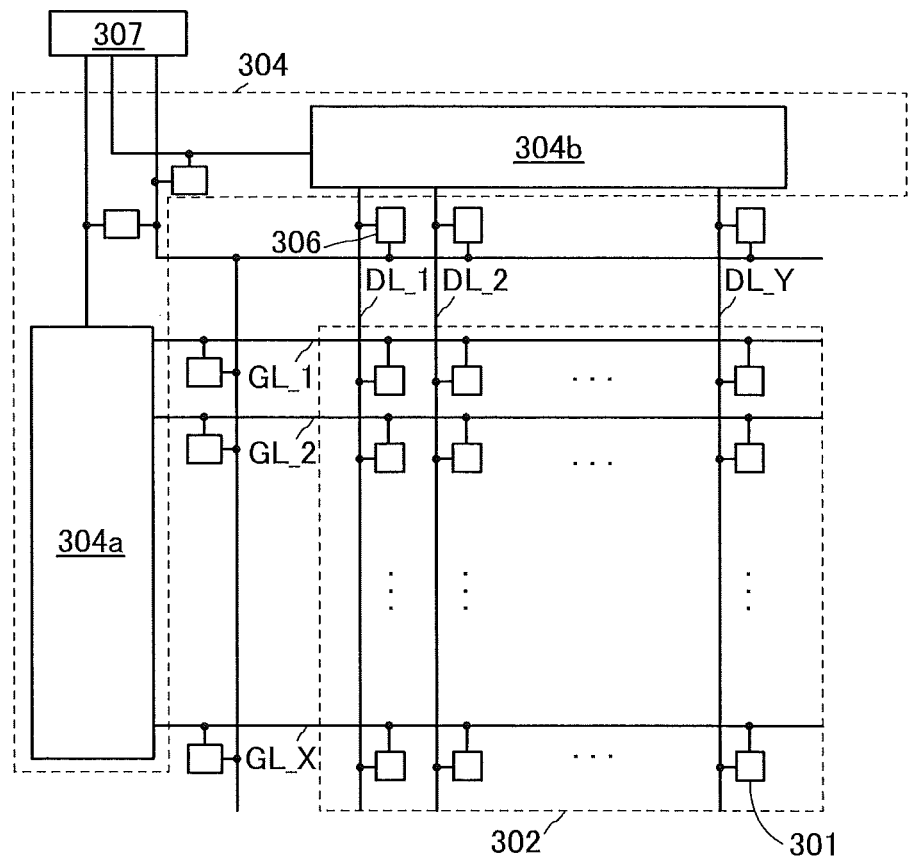
FIGS. 7A and 7B are a block diagram and a circuit diagram illustrating a display device.

The protection circuit 306 shown in FIG. 7A is connected to, for example, the scan line GL between the gate driver 304a and the pixel circuits 301. Alternatively, the protection circuit 306 is connected to the data line DL between the source driver 304b and the pixel circuit 301. Alternatively, the protection circuit 306 can be connected to a wiring between the gate driver 304a and the terminal portion 307. Alternatively, the protection circuit 306 can be connected to a wiring between the source driver 304b and the terminal portion 307. Note that the terminal portion 307 means a portion having terminals for inputting power, control signals, and video signals to the display device from external circuits.

The protection circuit 306 is a circuit that electrically connects a wiring connected to the protection circuit to another wiring when a potential out of a certain range is applied to the wiring connected to the protection circuit.

As illustrated in FIG. 7A, the protection circuits 306 are provided for the pixel portion 302 and the driver circuit portion 304, so that the resistance of the display device to overcurrent generated by electrostatic discharge (ESD) or the like can be improved. Note that the configuration of the protection circuits 306 is not limited to that, and for example, the protection circuit 306 may be configured to be connected to the gate driver 304a or the protection circuit 306 may be configured to be connected to the source driver 304b. Alternatively, the protection circuits 306 may be configured to be connected to the terminal portion 307.

In FIG. 7A, an example in which the driver circuit portion 304 includes the gate driver 304a and the source driver 304b is shown; however, the structure is not limited thereto. For example, only the gate driver 304a may be formed and a separately prepared substrate where a source driver circuit is formed (e.g., a driver circuit substrate formed with a single crystal semiconductor film or a polycrystalline semiconductor film) may be mounted.

Figure 7B:
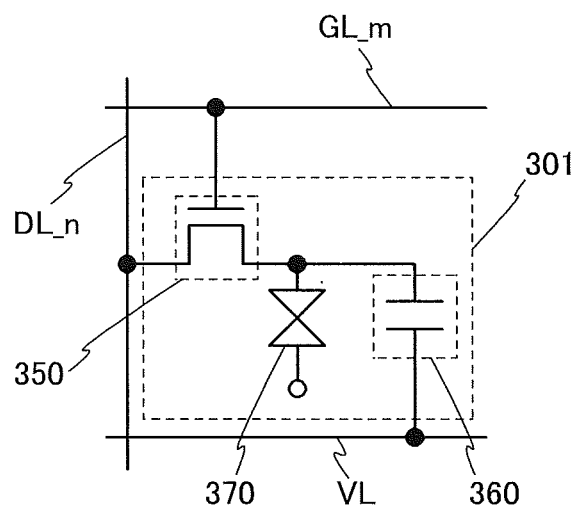

Each of the plurality of pixel circuits 301 in FIG. 7A can have the structure shown in FIG. 7B, for example.

The pixel circuit 301 illustrated in FIG. 7B includes a liquid crystal element 370, a transistor 350, and a capacitor 360.

The semiconductor device and the method for manufacturing the semiconductor device of one embodiment of the present invention can be applied to the transistor 350, for example.

The potential of one of a pair of electrodes of the liquid crystal element 370 is set according to the specifications of the pixel circuit 301 as appropriate. The alignment state of the liquid crystal element 370 depends on written data. A common potential may be applied to one of the pair of electrodes of the liquid crystal element 370 included in each of the plurality of pixel circuits 301. Further, the potential supplied to one of a pair of electrodes of the liquid crystal element 370 in the pixel circuit 301 in one row may be different from the potential supplied to one of a pair of electrodes of the liquid crystal element 370 in the pixel circuit 301 in another row.

As a driving method of the display device including the liquid crystal element 370, any of the following modes can be used, for example: a TN (twisted nematic) mode, an STN (super-twisted nematic) mode, a VA (vertical alignment) mode, an ASM (axially symmetric aligned micro-cell) mode, an OCB (optically compensated birefringence) mode, an FLC (ferroelectric liquid crystal) mode, an AFLC (antiferroelectric liquid crystal) mode, an MVA (multi-domain vertical alignment) mode, a PVA (patterned vertical alignment) mode, an IPS mode, an FFS (fringe field switching) mode, a TBA (transverse bend alignment) mode, and the like. Other examples of the driving method of the display device include ECB (electrically controlled birefringence) mode, PDLC (polymer dispersed liquid crystal) mode, PNLC (polymer network liquid crystal) mode, and a guest-host mode. Note that the present invention is not limited to this, and various liquid crystal elements and driving methods can be used as a liquid crystal element and a driving method thereof.

The liquid crystal element may be formed using a liquid crystal composition including liquid crystal exhibiting a blue phase and a chiral material. The liquid crystal exhibiting a blue phase has a short response time of 1 msec or less and has optical isotropy; thus, an alignment process is not necessary and the viewing angle dependence is small.

In the pixel circuit 301 in the m-th row and the n-th column, one of a source electrode and a drain electrode of the transistor 350 is electrically connected to the data line DL_n, and the other is electrically connected to the other of a pair of electrodes of the liquid crystal element 370. A gate electrode of the transistor 350 is electrically connected to a scan line GL_m. The transistor 350 has a function of controlling whether to write a data signal by being turned on or off.

One of a pair of electrodes of the capacitor 360 is electrically connected to a wiring to which a potential is supplied (hereinafter referred to as a potential supply line VL), and the other is electrically connected to the other of the pair of electrodes of the liquid crystal element 370. The potential of the potential supply line VL is set according to the specifications of the pixel circuits 301 as appropriate. The capacitor 360 functions as a storage capacitor for storing written data.

For example, in the display device including the pixel circuits 301 in FIG. 7A, the pixel circuits 301 are sequentially selected row by row by the gate driver 304a, whereby the transistors 350 are turned on and a data signal is written.

The pixel circuits 301 in which the data has been written are brought into a holding state by turning off the transistors 350. This operation is sequentially performed row by row; thus, an image can be displayed.

The structure described in this embodiment can be used in appropriate combination with the structure described in any of the other embodiments.

(Embodiment 6)

In this embodiment, a display module and electronic devices to which the semiconductor device of one embodiment of the present invention and a method for manufacturing the semiconductor device can be applied will be described with reference to FIG. 8 and FIGS. 9A to 9H.

Figure 8:
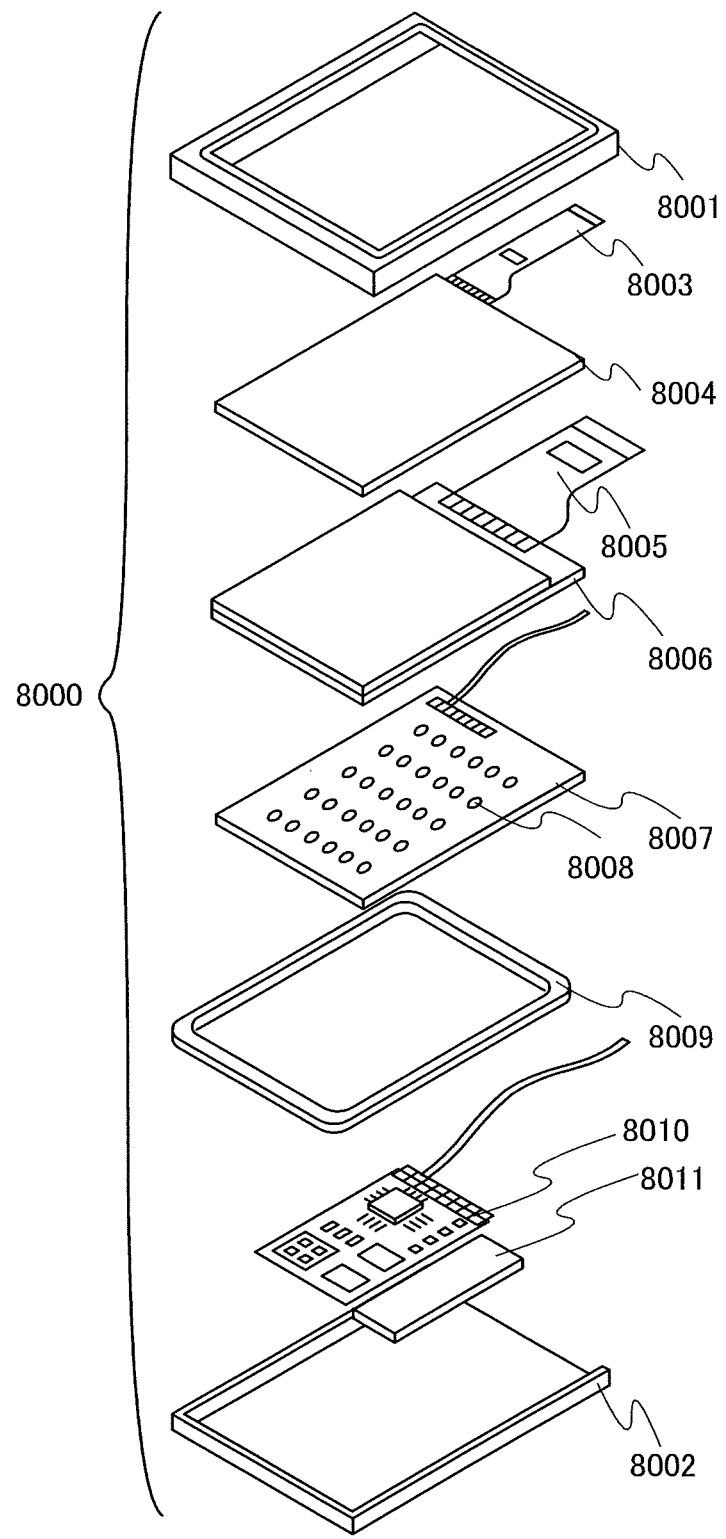
FIG. 8 is a view illustrating a display module.

In a display module 8000 in FIG. 8, a touch panel 8004 connected to an FPC 8003, a display panel 8006 connected to an FPC 8005, a backlight 8007, a frame 8009, a printed board 8010, and a battery 8011 are provided between an upper cover 8001 and a lower cover 8002.

The semiconductor device of one embodiment of the present invention and the method for manufacturing the semiconductor device can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may be formed so as to overlap with the display panel 8006. A counter substrate (sealing substrate) of the display panel 8006 can have a touch panel function. A photosensor may be provided in each pixel of the display panel 8006 so that the touch panel 8004 can function as an optical touch panel.

The backlight 8007 includes a light source 8008. The light source 8008 may be provided at an end portion of the backlight 8007 and a light diffusing plate may be used.

The frame 8009 protects the display panel 8006 and functions as an electromagnetic shield for blocking electromagnetic waves generated by the operation of the printed board 8010. The frame 8009 can function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 9A to 9H illustrate electronic devices. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 9A:
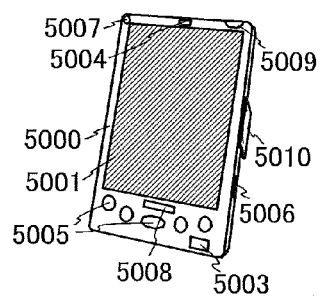
FIGS. 9A to 9H show electronic devices.
Figure 9B:
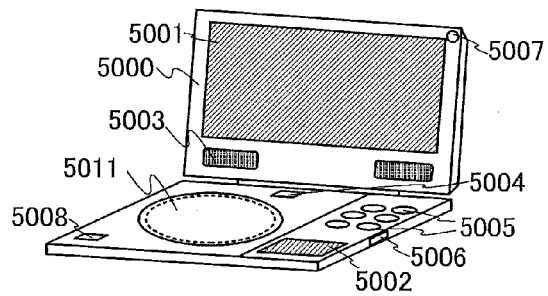
Figure 9C:
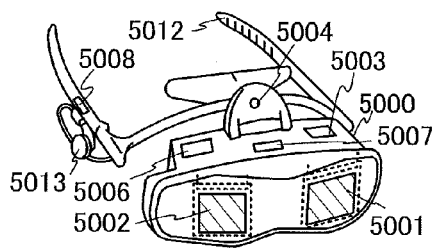
Figure 9D:
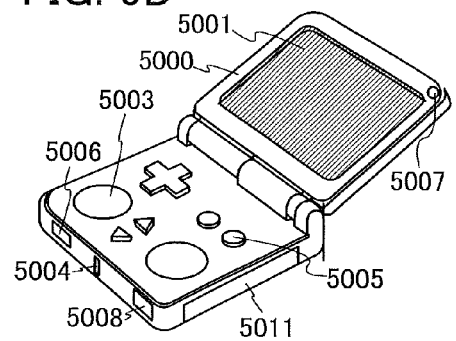
Figure 9E:
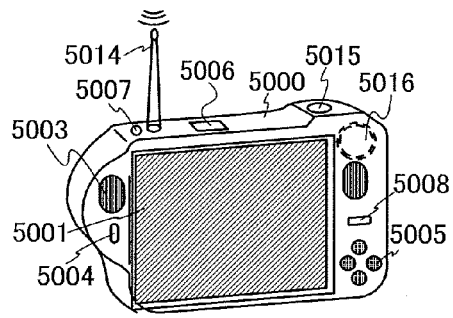
Figure 9F:
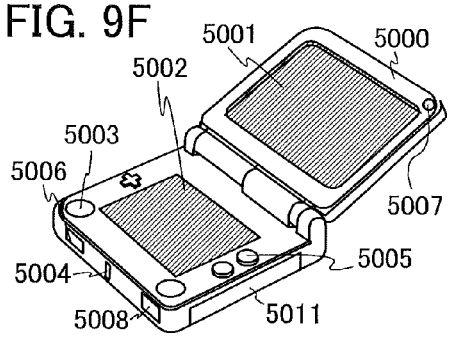
Figure 9G:
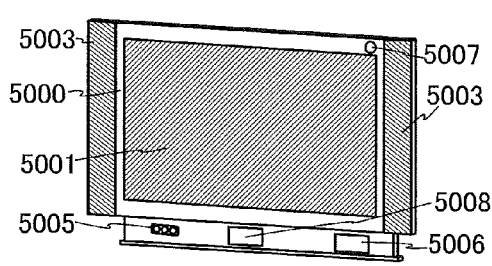
Figure 9H:
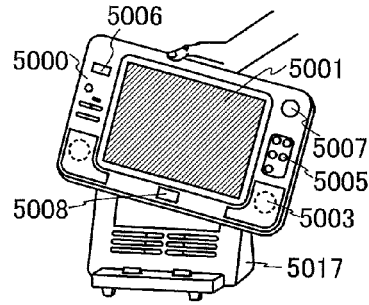

FIG. 9A illustrates a mobile computer, which can include a switch 5009, an infrared port 5010, and the like in addition to the above components. FIG. 9B illustrates a portable image regenerating device provided with a memory medium (e.g., a DVD regenerating device), which can include a second display portion 5002, a memory medium reading portion 5011, and the like in addition to the above objects. FIG. 9C illustrates a goggle-type display, which can include the second display portion 5002, a support 5012, an earphone 5013, and the like in addition to the above components. FIG. 9D illustrates a portable game machine, which can include the memory medium reading portion 5011 and the like in addition to the above components. FIG. 9E illustrates a digital camera with a television receiver function which can include an antenna 5014, a shutter button 5015, an image receiving portion 5016, and the like in addition to the above objects. FIG. 9F shows a portable game console, which can include the second display portion 5002, the memory medium reading portion 5011, and the like in addition to the above objects. FIG. 9G illustrates a television set, which can include a tuner, an image processing portion, and the like in addition to the above components. FIG. 9H illustrates a portable television receiver, which can include a charger 5017 capable of transmitting and receiving signals and the like in addition to the above objects.

The electronic devices illustrated in FIGS. 9A to 9H can have a variety of functions, for example, a function of displaying a variety of information (e.g., a still image, a moving image, and a text image) on a display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading program or data stored in a recording medium and displaying the program or data on a display portion. Furthermore, the electronic device including a plurality of display portions can have a function of displaying image information mainly on one display portion while displaying text information on another display portion, a function of displaying a three-dimensional image by displaying images where parallax is considered on a plurality of display portions, or the like. Furthermore, the electronic device including an image receiving portion can have a function of photographing a still image, a function of photographing a moving image, a function of automatically or manually correcting a photographed image, a function of storing a photographed image in a memory medium (an external memory medium or a memory medium incorporated in the camera), a function of displaying a photographed image on the display portion, or the like. Note that functions which can be provided for the electronic devices illustrated in FIGS. 9A to 9H are not limited to those described above, and the electronic devices can have a variety of functions.

Electronic devices described in this embodiment are characterized by having a display portion for displaying some sort of information.

The structure described in this embodiment can be used in appropriate combination with the structure described in any of the other embodiments.

EXAMPLE

In this example, the characteristics of the etchant of one embodiment of the present invention was measured, and then a sample was formed using the etchant, and the cross section of the sample was observed. The etchant which was used in this example and the sample formed using the etchant are described in detail below.

First, the etchant whose characteristics were measured in this example is described below.

<Etchant>

As the etchant, a mixed solution of aqueous hydrogen peroxide and an aqueous solution of an organic acid was used. In this example, a mixed solution of 16 kg of aqueous solution of organic acid and 3 kg of aqueous hydrogen peroxide was used as the etchant. The pH of the etchant was measured to be 5. Furthermore, the aqueous solution of organic acid was a solution which was obtained by combining a plurality of organic acids and water. In addition, the aqueous solution of organic acid included an acetic acid as one of its main component. Moreover, the aqueous organic acid and the aqueous hydrogen peroxide each contained water at 60 wt % or more.

Next, with use of the etchant, characteristics of the etching rates of a copper film and a molybdenum film which can be used as conductive films, and that of etching rates of an oxide semiconductor film and a metal oxide film which can be used as base films were measured.

The copper film used in this example was formed under the following conditions: a sputtering target was a metal target of copper (Cu), argon at a flow rate of 75 sccm was supplied as a sputtering gas into a reaction chamber of a sputtering apparatus, the pressure in the reaction chamber was controlled to 1.0 Pa, and a direct current power of 15 kW was supplied. Note that the copper film was formed at a substrate temperature of 100° C. The molybdenum film used in this example was formed under the following conditions: a sputtering target was a metal target of molybdenum (Mo), an argon with a flow rate of 95 sccm was supplied as a sputtering gas into a reaction chamber of a sputtering apparatus, the pressure in the reaction chamber was controlled to 0.85 Pa, and a direct current power of 35 kW was supplied. Note that the molybdenum film was formed at a substrate temperature of 80° C.

The oxide semiconductor film used in this example was formed under the following conditions: a sputtering target was a metal oxide target of In:Ga:Zn=1:1:1 (atomic ratio), oxygen at a flow rate of 100 sccm and argon at a flow rate of 100 sccm were supplied as a sputtering gas into a reaction chamber of a sputtering apparatus; the pressure in the reaction chamber was adjusted to 0.6 Pa; and an alternating-current power of 2.5 kW was supplied. Note that the oxide semiconductor film was formed at a substrate temperature of 170° C. Furthermore, the metal oxide film used in this example was formed under the following conditions: a sputtering target was a metal oxide target of In:Ga=7:93 (atomic ratio), oxygen at a flow rate of 15 sccm and argon at a flow rate of 15 sccm were supplied as a sputtering gas into a reaction chamber of a sputtering apparatus, the pressure in the reaction chamber was adjusted to 0.4 Pa, and a direct current power of 200 W was supplied. Note that the metal oxide film was formed at a substrate temperature of 170° C.

Next, Table 1 shows the etching rate of each of the above samples when the etchant of this example was used. Note that in Table 1, "Cu" represents the copper film, "Mo" represents the molybdenum film, "IGZO (1:1:1)" represents the oxide semiconductor film, and "IGO (7:93)" represents the metal oxide film.

TABLE 1

|  | Cu | Mo | IGZO (1:1:1) | IGO (7:93) |
|---|---|---|---|---|
| Etching rate (nm/min) | 206.50 | 24.60 | 0.26 | 0.19 |

As shown in Table 1, with the use of the etchant used in this example, the etching rate of the molybdenum film is approximately ⅛ of the etching rate of the copper film, and the etching rate of the oxide semiconductor film is approximately ½₀₀ of the etching rate of the copper film, and the etching rate of the metal oxide film is approximately ⅟₁₀₀₀ of the etching rate of the copper film. In addition, with the use of the etchant used in this example, the etching rate of the oxide semiconductor film is approximately ⅟₁₀₀ of the etching rate of the molybdenum film, and the etching rate of the metal oxide film is approximately ⅟₁₃₀ of the etching rate of the molybdenum film.

As described above, when the etchant used in this example is used, the etching rates of the oxide semiconductor film and the metal oxide film that can be used as base films are lower than the etching rates of the copper film and the molybdenum film which can be used as conductive films.

Next, a fabrication method of the sample subjected to cross-sectional observation in this example is described below.

<Fabrication Method of Sample for Cross-Sectional Observation>

First, a glass substrate was prepared. Then, a 35-nm-thick oxide semiconductor film was formed over the glass substrate by a sputtering method.

The oxide semiconductor film was formed under the following conditions: a sputtering target was a metal oxide target of In:Ga:Zn=1:1:1 (atomic ratio); oxygen at a flow rate of 100 sccm and argon at a flow rate of 100 sccm were supplied as a sputtering gas into a reaction chamber of a sputtering apparatus; the pressure in the reaction chamber was controlled to 0.6 Pa; and an alternating-current power of 2.5 kW was supplied. Note that the oxide semiconductor film was formed at a substrate temperature of 170° C.

Next, a conductive film was formed over the oxide semiconductor film. As the conductive film, a stack in which a 200-nm-thick copper film was stacked over a 10-nm-thick molybdenum film was formed.

The copper film was formed under the following conditions: a sputtering target was a metal target of copper (Cu), an argon at a flow rate of 75 sccm was supplied as a sputtering gas into a reaction chamber of a sputtering apparatus, the pressure in the reaction chamber was controlled to 1.0 Pa, and a direct current power of 15 kW was supplied. Note that the copper film was formed at a substrate temperature of 100° C. The molybdenum film was formed under the following conditions: a sputtering target was a metal target of molybdenum (Mo), argon at a flow rate of 95 sccm was supplied as a sputtering gas into a reaction chamber of a sputtering apparatus, the pressure in the reaction chamber was controlled to 0.85 Pa, and a direct current power of 35 kW was supplied. Note that the molybdenum film was formed at a substrate temperature of 80° C.

Next, a resist mask was formed over the copper film. The resist mask was formed in such a manner that a photosensitive resin was applied and then was exposed and developed in a desired region.

Then, an etchant was applied on the resist mask, and the copper film and the molybdenum film serving as conductive films were subjected to wet etching. At this time, the oxide semiconductor film which was formed as a base film of the molybdenum film served as an etching stopper film Note that the etchant whose characteristics were measured as described above was used.

Figure 10:
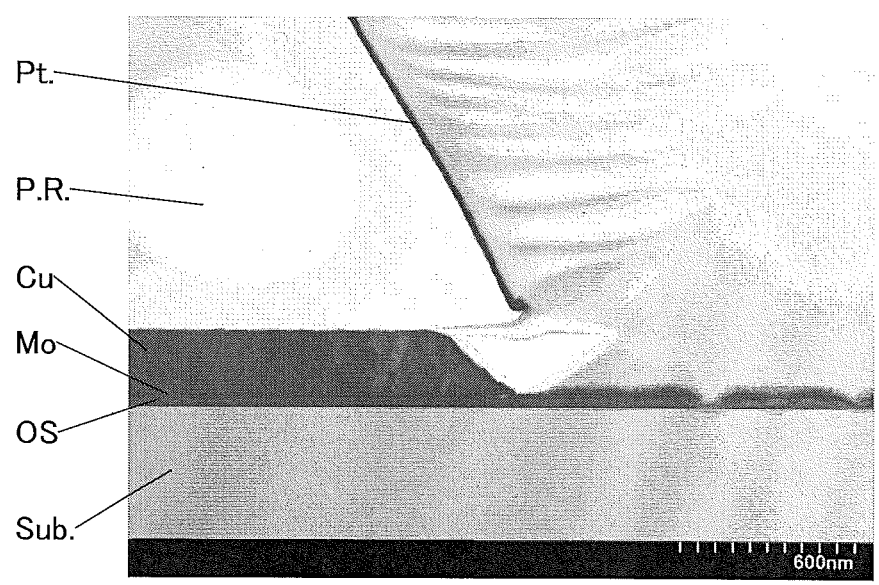
FIG. 10 is a cross-sectional TEM image of a sample manufactured in Example.

Through the above steps, the sample for cross-sectional observation in this example was formed, and the cross section of the sample was observed. FIG. 10 shows the observation result of the cross section of the sample formed in this example.

Note that the cross section was observed with the use of a transmission electron microscope (TEM). In FIG. 10, "Sub." represents a substrate, "OS" represents the oxide semiconductor film, "Mo" represents the molybdenum film, "Cu" represents the copper film, "P.R." represents the resist mask, and "Pt." represents platinum coating formed for the cross-sectional observation.

The TEM image in FIG. 10 indicates that the sample in this example obtain a favorable cross-sectional shape. In particular, from the result of the TEM image illustrated in FIG. 10, it was found that a side surface of the copper film has a tapered shape, and there is no undercut in the molybdenum film. Thus, the etchant of one embodiment of the present invention is an optimal etchant for collective etching of a molybdenum film and a copper film over the oxide semiconductor film collectively.

The structure described in this example can be used as appropriate in combination with any of the structures described in the other embodiments.

This application is based on Japanese Patent Application serial no. 2013-218953 filed with Japan Patent Office on Oct. 22, 2013, the entire contents of which are hereby incorporated by reference.

What is claimed is:

1. A method for manufacturing a semiconductor device, comprising:
    forming a first conductive film over a substrate;
    forming an insulating film over the first conductive film;
    forming an oxide semiconductor film over the insulating film to overlap with the first conductive film;
    forming a second conductive film including a first metal film containing molybdenum and a second metal film containing copper over the oxide semiconductor film; and
    selectively etching the second conductive film by using an etchant so that a portion of the oxide semiconductor film is exposed,
    wherein the oxide semiconductor film comprises a channel forming region,
    wherein the etchant comprises an aqueous solution of an organic acid and hydrogen peroxide, and
    wherein pH of the etchant is greater than or equal to 3 and less than or equal to 6.

2. The method for manufacturing a semiconductor device according to claim 1,
wherein the oxide semiconductor film is an In-M-Zn oxide, and
wherein M is Ti, Ga, Y, Zr, Sn, La, Ce, Nd, or Hf.

3. The method for manufacturing a semiconductor device according to claim 1, wherein the oxide semiconductor film is configured to be an etching stopper film at the time of etching the second conductive film by using the etchant.

4. The method for manufacturing a semiconductor device according to claim 1, wherein a source electrode layer and a drain electrode layer are formed by selectively etching the second conductive film.

5. The method for manufacturing a semiconductor device according to claim 4, further comprising steps of forming a first silicon oxynitride film over the source electrode layer and the drain electrode layer, a second silicon oxynitride film over the first silicon oxynitride film, and a silicon nitride film over the second silicon oxynitride film.

6. The method for manufacturing a semiconductor device according to claim 5, wherein the first silicon oxynitride film is in contact with the portion of the oxide semiconductor film.

7. A method for manufacturing a semiconductor device, comprising:
forming a first conductive film over a substrate;
forming an insulating film over the first conductive film;
forming an oxide semiconductor film over the insulating film to overlap with the first conductive film;
forming a metal oxide film over the oxide semiconductor film to overlap with the first conductive film;
forming a second conductive film including a first metal film containing molybdenum and a second metal film containing copper over the metal oxide film; and
selectively etching the second conductive film by using an etchant so that a portion of the metal oxide film is exposed,
wherein the oxide semiconductor film comprises a channel forming region,
wherein the etchant comprises an aqueous solution of an organic acid and hydrogen peroxide, and
wherein pH of the etchant is greater than or equal to 3 and less than or equal to 6.

8. The method for manufacturing a semiconductor device according to claim 7,
wherein the oxide semiconductor film is an In-M-Zn oxide, and
wherein M is Ti, Ga, Y, Zr, Sn, La, Ce, Nd, or Hf.

9. The method for manufacturing a semiconductor device according to claim 7,
wherein the metal oxide film is an In-M oxide, and
wherein M is Ti, Ga, Y, Zr, Sn, La, Ce, Nd, or Hf.

10. The method for manufacturing a semiconductor device according to claim 7, wherein the metal oxide film is configured to be an etching stopper film at the time of etching the second conductive film by using the etchant.

11. The method for manufacturing a semiconductor device according to claim 7, wherein a source electrode layer and a drain electrode layer are formed by selectively etching the second conductive film.

12. The method for manufacturing a semiconductor device according to claim 11, further comprising steps of forming a first silicon oxynitride film over the source electrode layer and the drain electrode layer, a second silicon oxynitride film over the first silicon oxynitride film, and a silicon nitride film over the second silicon oxynitride film.

13. The method for manufacturing a semiconductor device according to claim 12, wherein the first silicon oxynitride film is in contact with the portion of the metal oxide film.

14. A semiconductor device comprising:
a conductive film over a substrate;
an insulating film over the conductive film;
an oxide semiconductor film over the insulating film, the oxide semiconductor film overlapping with the conductive film;
a first metal oxide film over the oxide semiconductor film;
a second metal oxide film over the first metal oxide film;
a source electrode layer and a drain electrode layer over the second metal oxide film;
a first silicon oxynitride film over the source electrode layer and the drain electrode layer, the first silicon oxynitride film being in contact with a portion of the second metal oxide film;
a second oxynitride film over the first silicon oxynitride film; and
a silicon nitride film over the second oxynitride film,
wherein the oxide semiconductor film comprises a channel forming region,
wherein each of the source electrode layer and the drain electrode layer includes a first metal film containing molybdenum and a second metal film containing copper over the first metal film, and
wherein a side surface of the first metal film is located outside of a side surface of the second metal film.

15. The semiconductor device according to claim 14,
wherein the oxide semiconductor film is an In-M-Zn oxide, and
wherein M is Ti, Ga, Y, Zr, Sn, La, Ce, Nd, or Hf.

16. The semiconductor device according to claim 14,
wherein the first metal oxide film is an In-M-Zn oxide, and
wherein M is Ti, Ga, Y, Zr, Sn, La, Ce, Nd, or Hf.

17. The semiconductor device according to claim 14,
wherein the second metal oxide film is an In-M oxide, and
wherein M is Ti, Ga, Y, Zr, Sn, La, Ce, Nd, or Hf.

18. The semiconductor device according to claim 14, wherein the side surface of the second metal film is curved.

* * * * *

UNITED STATES PATENT AND TRADEMARK OFFICE
CERTIFICATE OF CORRECTION

PATENT NO. : 9,276,128 B2
APPLICATION NO. : 14/518362
DATED : March 1, 2016
INVENTOR(S) : Yasutaka Nakazawa et al.

Page 1 of 2

It is certified that error appears in the above-identified patent and that said Letters Patent is hereby corrected as shown below:

In the Specification:

Column 7, Line 56; Change "(2950 mm×3400 mm) Thus," to --(2950 mm×3400 mm). Thus,--.

Column 8, Line 38; Change "oxide W is" to --oxide (M is--.

Column 8, Line 56; Change "oxide film Note" to --oxide film. Note--.

Column 15, Line 52; Change "may formed" to --may be formed--.

Column 18, Line 11; Change "Tare" to --1 are--.

Column 18, Line 47; Change "etchant Thus," to --etchant. Thus,--.

Column 21, Line 5; Change "m, not" to --M, not--.

Column 21, Line 23; Change "In:MZn" to --In:M:Zn--.

Column 21, Line 40; Change "In:MZn" to --In:M:Zn--.

Column 21, Line 51; Change "In:MZn=1" to --In:M:Zn=1--.

Column 21, Line 51; Change "In:MZn=3" to --In:M:Zn=3--.

Column 21, Line 52; Change "In:MZn=4" to --In:M:Zn=4--.

Column 23, Line 8; Change "100 nm Thus," to --100 nm. Thus,--.

Column 23, Line 15; Change "2500 mm$^2$" to --2500 nm$^2$--.

Column 23, Line 35; Change "(0 axis)" to --(θ axis)--.

Column 23, Line 40; Change "2θ fixed" to --2θ fixed--.

Column 23, Line 55; Change "film Thus," to --film. Thus,--.

Column 32, Line 16; Change "film Note" to --film. Note--.

Signed and Sealed this
Twenty-third Day of August, 2016

Michelle K. Lee
*Director of the United States Patent and Trademark Office*

CERTIFICATE OF CORRECTION (continued)
U.S. Pat. No. 9,276,128 B2

In the Claims:

Column 33, Line 7, Claim 8; Change "wherein Mis Ti," to --wherein M is Ti,--.

Column 33, Line 51, Claim 9; Change "wherein Mis Ti," to --wherein M is Ti,--.